(12) United States Patent
Boitnott

(10) Patent No.: US 11,527,665 B2
(45) Date of Patent: Dec. 13, 2022

(54) PHOTOVOLTAIC MODULE WITH TRANSPARENT PERIMETER EDGES

(71) Applicant: GAF Energy LLC, Parsippany, NJ (US)

(72) Inventor: Nicholas Boitnott, Berkeley, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 17/738,292

(22) Filed: May 6, 2022

(65) Prior Publication Data

US 2022/0359776 A1 Nov. 10, 2022

Related U.S. Application Data

(60) Provisional application No. 63/185,091, filed on May 6, 2021.

(51) Int. Cl.
*H01L 31/048* (2014.01)
*H02S 20/23* (2014.01)

(52) U.S. Cl.
CPC ...... *H01L 31/0481* (2013.01); *H01L 31/0488* (2013.01); *H02S 20/23* (2014.12)

(58) Field of Classification Search
CPC . H01L 31/048; H01L 31/0481; H01L 31/049; H02S 20/23
See application file for complete search history.

(56) References Cited

U.S. PATENT DOCUMENTS

| 1,981,467 A | 11/1934 | Radtke |
| 3,156,497 A | 11/1964 | Lessard |
| 4,258,948 A | 3/1981 | Hoffmann |
| 4,349,220 A | 9/1982 | Carroll et al. |
| 4,499,702 A | 2/1985 | Turner |

(Continued)

FOREIGN PATENT DOCUMENTS

| CA | 2829440 C | 5/2019 |
| CH | 700095 A2 | 6/2010 |

(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Mayla Gonzalez Ramos
(74) *Attorney, Agent, or Firm* — Greenberg Traurig, LLP

(57) ABSTRACT

A system includes a plurality of photovoltaic modules, each having at least one solar cell, an encapsulant encapsulating the solar cell, a frontsheet, and a backsheet. The encapsulant and the frontsheet are transparent. The backsheet includes a first section and a second section juxtaposed with the first section. The first section is transparent and the second section is non-transparent. A first end of the frontsheet, a first end of the encapsulant, and the first section of the backsheet form a transparent portion. A first photovoltaic module overlays at least a portion of a second photovoltaic module. The transparent portion of the first photovoltaic module overlays at least a portion of the at least one solar cell of the second photovoltaic module.

18 Claims, 8 Drawing Sheets

(56) References Cited

U.S. PATENT DOCUMENTS

| | | |
|---|---|---|
| 4,636,577 A | 1/1987 | Peterpaul |
| 5,167,579 A | 12/1992 | Rotter |
| 5,590,495 A | 1/1997 | Bressler et al. |
| 5,642,596 A | 7/1997 | Waddington |
| 6,008,450 A | 12/1999 | Ohtsuka et al. |
| 6,046,399 A | 4/2000 | Kapner |
| 6,320,114 B1 | 11/2001 | Kuechler |
| 6,336,304 B1 | 1/2002 | Mimura et al. |
| 6,341,454 B1 | 1/2002 | Koleoglou |
| 6,407,329 B1 * | 6/2002 | Iino et al. ............... B32B 27/28 428/480 |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Podirsky |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rordigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,528,270 B2 | 12/2016 | Jenkins et al. |
| 9,605,432 B1 | 3/2017 | Robbins |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,923,515 B2 | 3/2018 | Rodrigues et al. |
| 9,938,729 B2 | 4/2018 | Coon |
| 9,991,412 B2 | 6/2018 | Gonzalez et al. |
| 9,998,067 B2 | 6/2018 | Kalkanoglu et al. |
| 10,027,273 B2 | 7/2018 | West et al. |
| 10,115,850 B2 | 10/2018 | Rodrigues et al. |
| 10,128,660 B1 | 11/2018 | Apte et al. |
| 10,187,005 B2 | 1/2019 | Rodrigues et al. |
| 10,256,765 B2 | 4/2019 | Rodrigues et al. |
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,177,639 B1 | 11/2021 | Nguyen et al. |
| 11,217,715 B2 | 1/2022 | Sharenko et al. |
| 11,251,744 B1 | 2/2022 | Bunea et al. |
| 11,258,399 B2 | 2/2022 | Kalkanoglu et al. |
| 11,283,394 B2 | 3/2022 | Perkins et al. |
| 2002/0053360 A1 | 5/2002 | Kinoshita et al. |
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2005/0115603 A1 | 6/2005 | Yoshida et al. |
| 2005/0144870 A1 | 7/2005 | Dinwoodie |
| 2006/0042683 A1 | 3/2006 | Gangemi |
| 2007/0181174 A1 | 8/2007 | Ressler |
| 2007/0193618 A1 | 8/2007 | Bressler et al. |
| 2008/0006323 A1 | 1/2008 | Kalkanoglu et al. |
| 2008/0035140 A1 | 2/2008 | Placer et al. |
| 2008/0315061 A1 | 2/2008 | Placerl. et al. |
| 2008/0271774 A1 | 11/2008 | Kalkanoglu et al. |
| 2009/0000222 A1 | 1/2009 | Kalkanoglu et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2010/0101634 A1 | 4/2010 | Frank et al. |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0313499 A1 | 12/2010 | Gangemi |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0239555 A1 | 10/2011 | Cook et al. |
| 2011/0302859 A1 | 12/2011 | Crasnianski |
| 2012/0060902 A1 | 3/2012 | Drake |
| 2012/0137600 A1 | 6/2012 | Jenkins |

(56) References Cited

U.S. PATENT DOCUMENTS

| | | |
|---|---|---|
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2013/0014455 A1 | 1/2013 | Grieco |
| 2013/0193769 A1 | 8/2013 | Mehta et al. |
| 2013/0247988 A1 | 9/2013 | Reese et al. |
| 2013/0306137 A1 | 11/2013 | Ko |
| 2014/0150843 A1 | 6/2014 | Pearce et al. |
| 2014/0173997 A1 | 6/2014 | Jenkins |
| 2014/0174004 A1* | 6/2014 | Livsey .................. F24S 25/61 52/173.3 |
| 2014/0179220 A1 | 6/2014 | Railkar et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179726 A1 | 6/2017 | Garrity et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0351502 A1 | 12/2018 | Almy et al. |
| 2019/0030867 A1 | 1/2019 | Sun et al. |
| 2019/0081436 A1 | 3/2019 | Onodi et al. |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0115223 A1 | 4/2021 | Bonekamp et al. |
| 2021/0159353 A1 | 5/2021 | Li et al. |
| 2021/0343886 A1* | 11/2021 | Sharenko .............. H01L 31/048 |

FOREIGN PATENT DOCUMENTS

| | | |
|---|---|---|
| CN | 202797032 U | 3/2013 |
| DE | 1958248 A1 | 11/1971 |
| EP | 1837162 A1 | 9/2007 |
| EP | 1774372 A1 | 7/2011 |
| EP | 2784241 A1 | 10/2014 |
| JP | 2001-098703 A | 10/2002 |
| JP | 2017-027735 A | 2/2017 |
| WO | 2011/049944 A1 | 4/2011 |
| WO | 2015/133632 A1 | 9/2015 |
| WO | 2019/201416 A1 | 10/2019 |

OTHER PUBLICATIONS

RGS Energy, 3.5kW Powerhouse 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

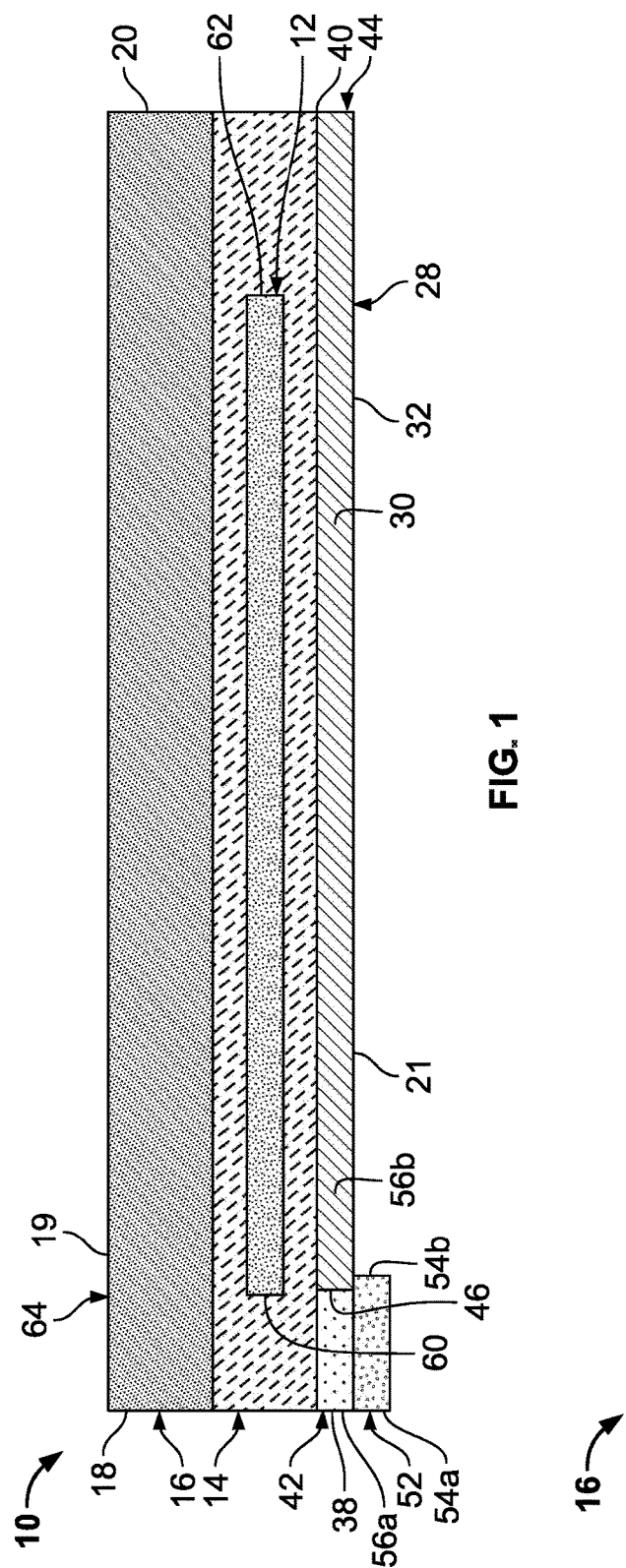
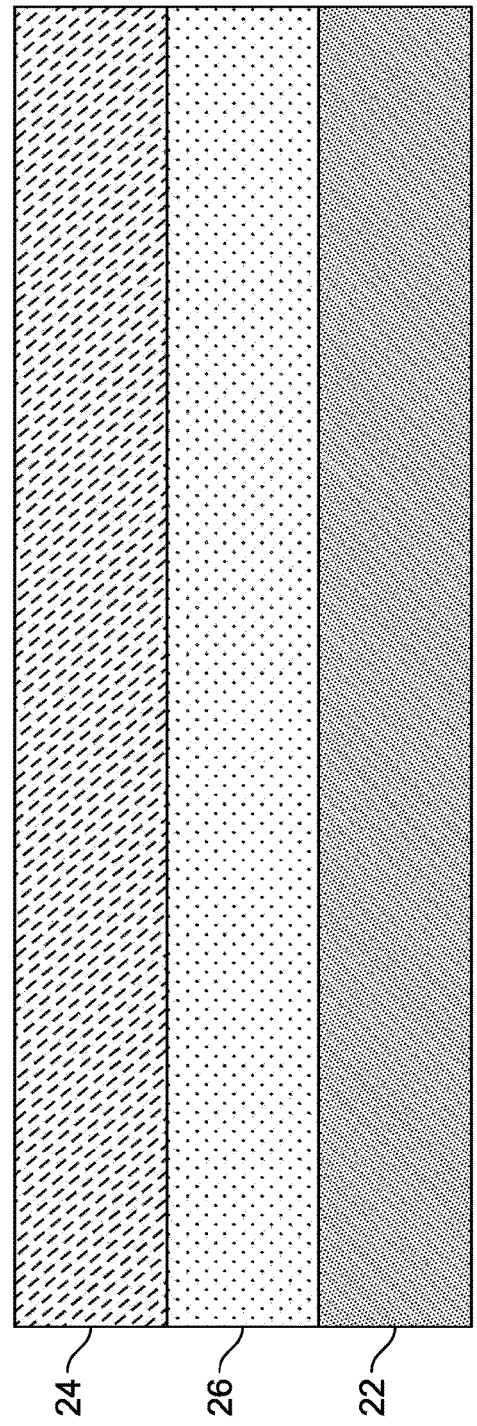
FIG. 1
FIG. 2

PHOTOVOLTAIC MODULE WITH TRANSPARENT PERIMETER EDGES

CROSS-REFERENCE TO RELATED APPLICATION

This application is a Section 111(a) application relating to and claiming the benefit of commonly-owned, co-pending U.S. Provisional Patent Application Ser. No. 63/185,091, filed May 6, 2021, entitled "PHOTOVOLTAIC MODULE WITH TRANSPARENT PERIMETER EDGES," the contents of which are incorporated herein by reference in its entirety.

FIELD OF THE INVENTION

The present invention relates to building integrated photovoltaic modules, and, more particularly, building integrated photovoltaic modules having transparent perimeters for improving energy density thereof.

BACKGROUND

Photovoltaic systems having solar panels are commonly installed on roofing of structures.

SUMMARY

In some embodiments, a system includes a plurality of photovoltaic modules, each of the photovoltaic modules includes at least one solar cell; an encapsulant encapsulating the at least one solar cell, wherein the encapsulant includes a first end, a second end opposite the first end, a first surface extending from the first end to the second end, and a second surface opposite the first surface and extending from the first end to the second end, wherein the encapsulant is transparent; a frontsheet juxtaposed with the first surface of the encapsulant, wherein the frontsheet includes a first end and a second end opposite the first end of the frontsheet, wherein the frontsheet is transparent; and a backsheet juxtaposed with the second surface of the encapsulant, wherein the backsheet includes a first section, and a second section juxtaposed with the first section, wherein the first section is transparent, wherein the second section is non-transparent, wherein the first end of the frontsheet, the first end of the encapsulant, and the first section of the backsheet form a transparent portion, wherein a first photovoltaic module of the plurality of photovoltaic modules overlays at least a portion of a second photovoltaic module of the plurality of photovoltaic modules, and wherein the transparent portion of the first photovoltaic module overlays at least a portion of the at least one solar cell of the second photovoltaic module.

In some embodiments, each of the photovoltaic modules includes a first edge, and a second edge opposite the first edge, wherein the first section extends from the first edge to a first location intermediate the first edge and the second edge, and wherein the second section extends from the first location to the second edge. In some embodiments, the backsheet includes a first surface, a second surface opposite the first surface of the backsheet, a first side extending from the first edge to the second edge, and a second side opposite the first side and extending from the first edge to the second edge, wherein the first section extends from the first side to the second side and from the first surface to the second surface. In some embodiments, the second section extends from the first side to the second side and from the first surface of the backsheet to the second surface of the backsheet. In some embodiments, the first section includes a width measured from the first edge to the first location. In some embodiments, the width is 5 mm to 30 mm.

In some embodiments, each of the plurality of photovoltaic modules includes an adhesive juxtaposed with the backsheet, and wherein the adhesive is transparent. In some embodiments, the adhesive is juxtaposed with the first section. In some embodiments, the adhesive is substantially aligned with the first section. In some embodiments, the adhesive optically couples the first photovoltaic module with the second photovoltaic module. In some embodiments, each of the photovoltaic modules includes a creepage distance extending from the first edge to a first end of the at least one solar cell. In some embodiments, the creepage distance is equal to the width of the first section of the backsheet. In some embodiments, the transparent portion of the first photovoltaic module overlays the at least one solar cell at an overlap distance. In some embodiments, the overlap distance is less than or equal to the creepage distance. In some embodiments, the first photovoltaic module overlaps the second photovoltaic module of a distance twice the creepage distance. In some embodiments, the first section includes a first layer and the second section includes a second layer. In some embodiments, each of the photovoltaic modules includes a first edge, and a second edge opposite the first edge, wherein the first layer extends from the first edge to the second edge, and wherein the second layer extends from the second edge to a first location intermediate the first edge and the second edge.

In some embodiments, a photovoltaic module includes at least one solar cell; an encapsulant encapsulating the at least one solar cell, wherein the encapsulant includes a first end, a second end opposite the first end, a first surface extending from the first end to the second end, and a second surface opposite the first surface and extending from the first end to the second end, wherein the encapsulant is transparent; a frontsheet juxtaposed with the first surface of the encapsulant, wherein the frontsheet includes a first end and a second end opposite the first end of the frontsheet, wherein the frontsheet is transparent; and a backsheet juxtaposed with the second surface of the encapsulant, wherein the backsheet includes a first section, and a second section juxtaposed with the first section, wherein the first section is transparent, wherein the second section is non-transparent, wherein the first end of the frontsheet, the first end of the encapsulant, and the first section of the backsheet form a transparent portion, wherein the transparent portion of the photovoltaic module is configured to overlay at least a portion of at least one solar cell of another photovoltaic module.

In some embodiments, a system includes a plurality of photovoltaic modules, each of the photovoltaic modules includes at least one solar cell; an encapsulant encapsulating the at least one solar cell, wherein the encapsulant includes a first end, a second end opposite the first end, a first surface extending from the first end to the second end, and a second surface opposite the first surface and extending from the first end to the second end, wherein the encapsulant is transparent; a frontsheet juxtaposed with the first surface of the encapsulant, wherein the frontsheet includes a first end and a second end opposite the first end of the frontsheet, wherein the frontsheet is transparent; and a backsheet juxtaposed with the second surface of the encapsulant, wherein the backsheet includes a first section, wherein the first section includes a beveled portion, and wherein a first photovoltaic module of the plurality of photovoltaic modules overlays at least a portion of a second photovoltaic module of the plurality of photovoltaic modules, and wherein the beveled portion of the first photovoltaic module overlays at least a portion of the at least one solar cell of the second photovoltaic module. In some embodiments, the beveled portion includes a reflective portion.

BRIEF DESCRIPTION OF THE DRAWINGS

FIG. 1 shows a side schematic view of an embodiment of a photovoltaic module;

FIG. 2 shows a side schematic view of an embodiment of a frontsheet employed by the photovoltaic module of FIG. 1;

FIG. 3A shows a top plan view of an embodiment of a backsheet employed by the photovoltaic module of FIG. 1, while FIG. 3B shows a top plan view of another embodiment of a backsheet;

DETAILED DESCRIPTION

Figure 3:
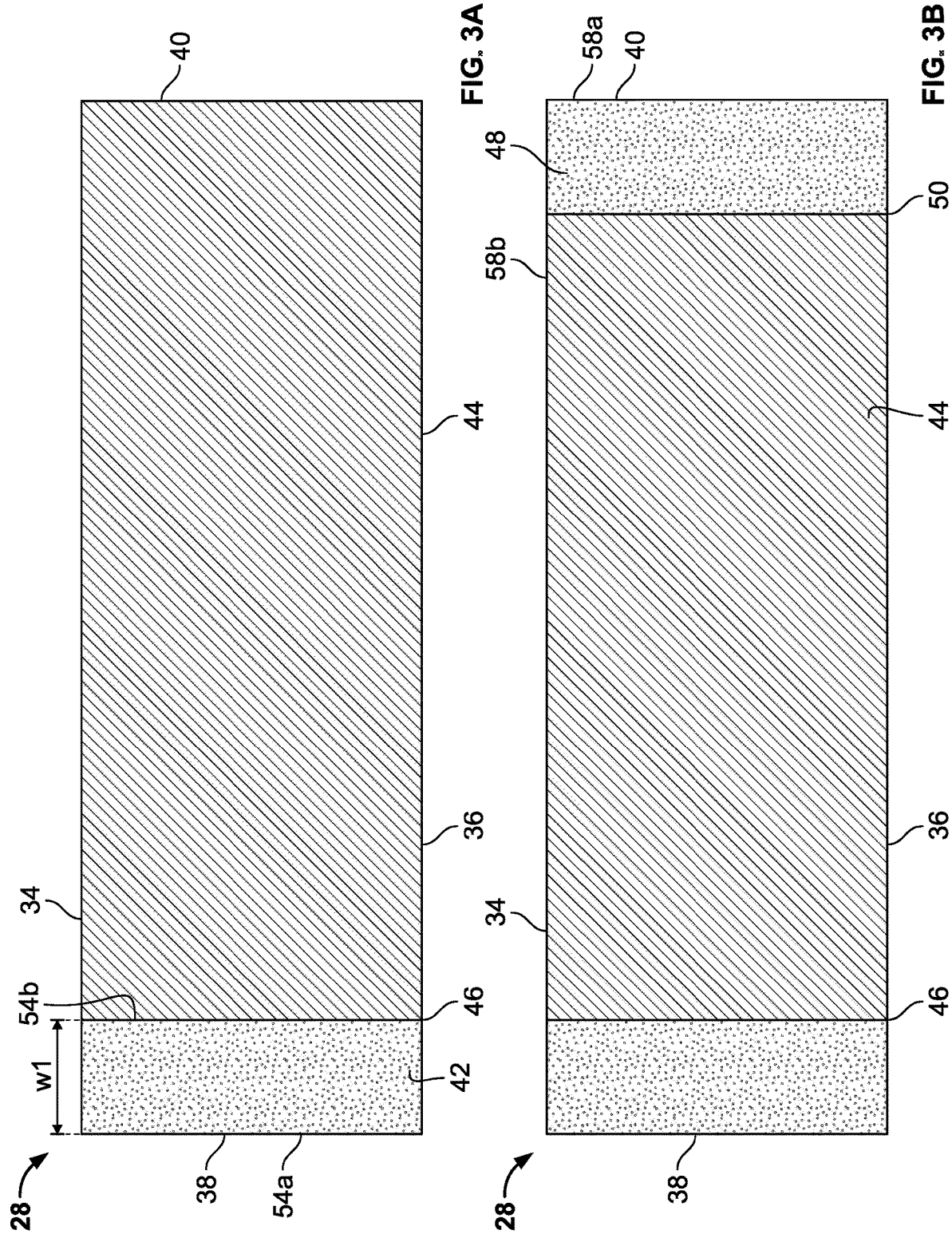

The present invention will be further explained with reference to the attached drawings, wherein like structures are referred to by like numerals throughout the several views. The drawings shown are not necessarily to scale, with emphasis instead generally being placed upon illustrating the principles of the present invention. Further, some features may be exaggerated to show details of particular components.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

Throughout the specification and claims, the following terms take the meanings explicitly associated herein, unless the context clearly dictates otherwise. The phrases "in one embodiment" and "in some embodiments" as used herein do not necessarily refer to the same embodiment(s), though they may. Furthermore, the phrases "in some embodiments" and "in some other embodiments" as used herein do not necessarily refer to a different embodiment, although they may. Thus, as described below, various embodiments of the invention may be readily combined, without departing from the scope or spirit of the invention.

The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Referring to FIGS. 1 through 2, in some embodiments, a photovoltaic module 10 includes at least one solar cell 12, an encapsulant 14 encapsulating the at least one solar cell 12, and a frontsheet 16 juxtaposed with the encapsulant 14. In some embodiments, the frontsheet 16 is juxtaposed with a first surface of the encapsulant 14. As used herein, the terms "encapsulating" and "encapsulates" mean to partially or fully envelope or enclose, and with respect to certain embodiments of the photovoltaic module 10, the at least one solar cell 12 is fully enveloped by or enclosed within the encapsulant 14, or partially enveloped by or enclosed within the encapsulant 14. In some embodiments, the at least one solar cell 12 includes a plurality of solar cells 12. In some embodiments, the at least one solar cell 12 is electrically active. In some embodiments, the photovoltaic module 10 includes a first end 18, a second end 20 opposite the first end 18, a first surface 19 extending from the first end 18 to the second end 20, and a second surface 21 opposite the first surface 19 and extending from the first end 18 to the second end 20. In some embodiments, the first surface 19 is an upper, sun facing-side surface of the photovoltaic module 10, and the second surface 21 is a lower surface configured to face a roof deck on which the photovoltaic module 10 is installed.

In some embodiments, the encapsulant 14 may be made from polyolefins, ethyl vinyl acetates, ionomers, silicones, poly vinyl butyral, epoxies, polyurethanes, or combinations/hybrids thereof. In some embodiments, the encapsulant 14 is composed of thermosetting polyolefin. In some embodiments, the encapsulant 14 is composed of thermoplastic polyolefin.

In some embodiments, the encapsulant 14 has a thickness of 0.4 mm to 1.8 mm. In some embodiments, the encapsulant 14 has a thickness of 0.4 mm to 1.7 mm. In some embodiments, the encapsulant 14 has a thickness of 0.4 mm to 1.6 mm. In some embodiments, the encapsulant 14 has a thickness of 0.4 mm to 1.5 mm. In some embodiments, the encapsulant 14 has a thickness of 0.4 mm to 1.4 mm. In some embodiments, the encapsulant 14 has a thickness of 0.4 mm to 1.3 mm. In some embodiments, the encapsulant 14 has a thickness of 0.4 mm to 1.2 mm. In some embodiments, the encapsulant 14 has a thickness of 0.4 mm to 1.1 mm. In some embodiments, the encapsulant 14 has a thickness of 0.4 mm to 1.0 mm. In some embodiments, the encapsulant 14 has a thickness of 0.4 mm to 0.9 mm. In some embodiments, the encapsulant 14 has a thickness of 0.4 mm to 0.8 mm. In some embodiments, the encapsulant 14 has a thickness of 0.4 mm to 0.7 mm. In some embodiments, the encapsulant 14 has a thickness of 0.4 mm to 0.6 mm. In some embodiments, the encapsulant 14 has a thickness of 0.4 mm to 0.5 mm.

In some embodiments, the encapsulant 14 has a thickness of 0.5 mm to 1.8 mm. In some embodiments, the encapsulant 14 has a thickness of 0.5 mm to 1.7 mm. In some embodiments, the encapsulant 14 has a thickness of 0.5 mm to 1.6 mm. In some embodiments, the encapsulant 14 has a thickness of 0.5 mm to 1.5 mm. In some embodiments, the encapsulant 14 has a thickness of 0.5 mm to 1.4 mm. In some embodiments, the encapsulant 14 has a thickness of 0.5 mm to 1.3 mm. In some embodiments, the encapsulant 14 has a thickness of 0.5 mm to 1.2 mm. In some embodiments, the encapsulant 14 has a thickness of 0.5 mm to 1.1 mm. In some embodiments, the encapsulant 14 has a thickness of 0.5 mm to 1.0 mm. In some embodiments, the encapsulant 14 has a thickness of 0.5 mm to 0.9 mm. In some embodiments, the encapsulant 14 has a thickness of 0.5 mm to 0.8 mm. In some embodiments, the encapsulant 14 has a thickness of 0.5 mm to 0.7 mm. In some embodiments, the encapsulant 14 has a thickness of 0.5 mm to 0.6 mm.

In some embodiments, the encapsulant 14 has a thickness of 0.6 mm to 1.8 mm. In some embodiments, the encapsulant 14 has a thickness of 0.6 mm to 1.7 mm. In some embodiments, the encapsulant 14 has a thickness of 0.6 mm to 1.6 mm. In some embodiments, the encapsulant 14 has a thickness of 0.6 mm to 1.5 mm. In some embodiments, the encapsulant 14 has a thickness of 0.6 mm to 1.4 mm. In some embodiments, the encapsulant 14 has a thickness of 0.6 mm to 1.3 mm. In some embodiments, the encapsulant 14 has a thickness of 0.6 mm to 1.2 mm. In some embodiments, the encapsulant 14 has a thickness of 0.6 mm to 1.1 mm. In some embodiments, the encapsulant 14 has a thickness of 0.6 mm to 1.0 mm. In some embodiments, the encapsulant 14 has a thickness of 0.6 mm to 0.9 mm. In some embodiments, the encapsulant 14 has a thickness of 0.6 mm to 0.8 mm. In some embodiments, the encapsulant 14 has a thickness of 0.6 mm to 0.7 mm.

In some embodiments, the encapsulant 14 has a thickness of 0.7 mm to 1.8 mm. In some embodiments, the encapsulant 14 has a thickness of 0.7 mm to 1.7 mm. In some embodiments, the encapsulant 14 has a thickness of 0.7 mm to 1.6 mm. In some embodiments, the encapsulant 14 has a thickness of 0.7 mm to 1.5 mm. In some embodiments, the encapsulant 14 has a thickness of 0.7 mm to 1.4 mm. In some embodiments, the encapsulant 14 has a thickness of 0.7 mm to 1.3 mm. In some embodiments, the encapsulant 14 has a thickness of 0.7 mm to 1.2 mm. In some embodiments, the encapsulant 14 has a thickness of 0.7 mm to 1.1 mm. In some embodiments, the encapsulant 14 has a thickness of 0.7 mm to 1.0 mm. In some embodiments, the encapsulant 14 has a thickness of 0.7 mm to 0.9 mm. In some embodiments, the encapsulant 14 has a thickness of 0.7 mm to 0.8 mm.

In some embodiments, the encapsulant 14 has a thickness of 0.8 mm to 1.8 mm. In some embodiments, the encapsulant 14 has a thickness of 0.8 mm to 1.7 mm. In some embodiments, the encapsulant 14 has a thickness of 0.8 mm to 1.6 mm. In some embodiments, the encapsulant 14 has a thickness of 0.8 mm to 1.5 mm. In some embodiments, the encapsulant 14 has a thickness of 0.8 mm to 1.4 mm. In some embodiments, the encapsulant 14 has a thickness of 0.8 mm to 1.3 mm. In some embodiments, the encapsulant 14 has a thickness of 0.8 mm to 1.2 mm. In some embodiments, the encapsulant 14 has a thickness of 0.8 mm to 1.1 mm. In some embodiments, the encapsulant 14 has a thickness of 0.8 mm to 1.0 mm. In some embodiments, the encapsulant 14 has a thickness of 0.8 mm to 0.9 mm.

In some embodiments, the encapsulant 14 has a thickness of 0.9 mm to 1.8 mm. In some embodiments, the encapsulant 14 has a thickness of 0.9 mm to 1.7 mm. In some embodiments, the encapsulant 14 has a thickness of 0.9 mm to 1.6 mm. In some embodiments, the encapsulant 14 has a thickness of 0.9 mm to 1.5 mm. In some embodiments, the encapsulant 14 has a thickness of 0.9 mm to 1.4 mm. In some embodiments, the encapsulant 14 has a thickness of 0.9 mm to 1.3 mm. In some embodiments, the encapsulant 14 has a thickness of 0.9 mm to 1.2 mm. In some embodiments, the encapsulant 14 has a thickness of 0.9 mm to 1.1 mm. In some embodiments, the encapsulant 14 has a thickness of 0.9 mm to 1.0 mm.

In some embodiments, the encapsulant 14 has a thickness of 1.0 mm to 1.8 mm. In some embodiments, the encapsulant 14 has a thickness of 1.0 mm to 1.7 mm. In some embodiments, the encapsulant 14 has a thickness of 1.0 mm to 1.6 mm. In some embodiments, the encapsulant 14 has a thickness of 1.0 mm to 1.5 mm. In some embodiments, the encapsulant 14 has a thickness of 1.0 mm to 1.4 mm. In some embodiments, the encapsulant 14 has a thickness of 1.0 mm to 1.3 mm. In some embodiments, the encapsulant 14 has a thickness of 1.0 mm to 1.2 mm. In some embodiments, the encapsulant 14 has a thickness of 1.0 mm to 1.1 mm.

In some embodiments, the encapsulant 14 has a thickness of 1.1 mm to 1.8 mm. In some embodiments, the encapsulant 14 has a thickness of 1.1 mm to 1.7 mm. In some embodiments, the encapsulant 14 has a thickness of 1.1 mm to 1.6 mm. In some embodiments, the encapsulant 14 has a thickness of 1.1 mm to 1.5 mm. In some embodiments, the encapsulant 14 has a thickness of 1.1 mm to 1.4 mm. In some embodiments, the encapsulant 14 has a thickness of 1.1 mm to 1.3 mm. In some embodiments, the encapsulant 14 has a thickness of 1.1 mm to 1.2 mm.

In some embodiments, the encapsulant 14 has a thickness of 1.2 mm to 1.8 mm. In some embodiments, the encapsulant 14 has a thickness of 1.2 mm to 1.7 mm. In some embodiments, the encapsulant 14 has a thickness of 1.2 mm to 1.6 mm. In some embodiments, the encapsulant 14 has a thickness of 1.2 mm to 1.5 mm. In some embodiments, the encapsulant 14 has a thickness of 1.2 mm to 1.4 mm. In some embodiments, the encapsulant 14 has a thickness of 1.2 mm to 1.3 mm.

In some embodiments, the encapsulant 14 has a thickness of 1.3 mm to 1.8 mm. In some embodiments, the encapsulant 14 has a thickness of 1.3 mm to 1.7 mm. In some embodiments, the encapsulant 14 has a thickness of 1.3 mm to 1.6 mm. In some embodiments, the encapsulant 14 has a thickness of 1.3 mm to 1.5 mm. In some embodiments, the encapsulant 14 has a thickness of 1.3 mm to 1.4 mm.

In some embodiments, the encapsulant 14 has a thickness of 1.4 mm to 1.8 mm. In some embodiments, the encapsulant 14 has a thickness of 1.4 mm to 1.7 mm. In some embodiments, the encapsulant 14 has a thickness of 1.4 mm to 1.6 mm. In some embodiments, the encapsulant 14 has a thickness of 1.4 mm to 1.5 mm.

In some embodiments, the encapsulant 14 has a thickness of 1.5 mm to 1.8 mm. In some embodiments, the encapsulant 14 has a thickness of 1.5 mm to 1.7 mm. In some embodiments, the encapsulant 14 has a thickness of 1.5 mm to 1.6 mm. In some embodiments, the encapsulant 14 has a thickness of 1.6 mm to 1.8 mm. In some embodiments, the encapsulant 14 has a thickness of 1.6 mm to 1.7 mm. In some embodiments, the encapsulant 14 has a thickness of 1.7 mm to 1.8 mm. In some embodiments, the encapsulant 14 has a thickness of 0.4 mm. In some embodiments, the encapsulant 14 has a thickness of 0.5 mm. In some embodiments, the encapsulant 14 has a thickness of 0.6 mm. In some embodiments, the encapsulant 14 has a thickness of 0.7 mm. In some embodiments, the encapsulant 14 has a thickness of 0.8 mm. In some embodiments, the encapsulant 14 has a thickness of 0.9 mm. In some embodiments, the encapsulant 14 has a thickness of 1.0 mm. In some embodiments, the encapsulant 14 has a thickness of 1.1 mm. In some embodiments, the encapsulant 14 has a thickness of 1.2 mm. In some embodiments, the encapsulant 14 has a thickness of 1.3 mm. In some embodiments, the encapsulant 14 has a thickness of 1.4 mm. In some embodiments, the encapsulant 14 has a thickness of 1.5 mm. In some embodiments, the encapsulant 14 has a thickness of 1.6 mm. In some embodiments, the encapsulant 14 has a thickness of 1.7 mm. In some embodiments, the encapsulant 14 has a thickness of 1.8 mm.

In some embodiments, the frontsheet 16 includes a glass layer 22 and a polymer layer 24 attached to a first surface of the glass layer 22. In some embodiments, the frontsheet 16 is juxtaposed with a first surface of the encapsulant 14. In some embodiments, each of the encapsulant 14, the glass layer 22, and the polymer layer 24 is transparent. In some embodiments, the polymer layer 24 is attached to the glass layer 22 by an adhesive layer 26. In some embodiments, the adhesive layer 26 may include polyolefin elastomers (POE), polyvinyl butyrate, acrylic, silicone, or polycarbonate. In some embodiments, the adhesive layer 26 may include pressure sensitive adhesives. In some embodiments, the polymer layer 24 is attached to the glass layer 22 by thermal bonding. In some embodiments, the frontsheet 16 includes at least one of the glass layer 22 or the polymer layer 24. In some embodiments, the adhesive layer 26 is transparent. As used herein, the term "transparent" means having a solar weighted transmittance of 80% or greater, and with respect to certain embodiments of the photovoltaic module 10, a transparent layer of the photovoltaic module has a solar weighted transmittance of 80% or greater.

In some embodiments, the glass layer 22 has a thickness of 2.5 mm to 4 mm. In some embodiments, the glass layer 22 has a thickness of 2.5 mm to 3.5 mm. In some embodiments, the glass layer 22 has a thickness of 2.5 mm to 3 mm. In some embodiments, the glass layer 22 has a thickness of 3 mm to 4 mm. In some embodiments, the glass layer 22 has a thickness of 3.5 mm to 4 mm. In some embodiments, the glass layer 22 has a thickness of 2.6 mm to 3.5 mm. In some embodiments, the glass layer 22 has a thickness of 2.7 mm to 3.5 mm. In some embodiments, the glass layer 22 has a thickness of 2.8 mm to 3.5 mm. In some embodiments, the glass layer 22 has a thickness of 2.9 mm to 3.5 mm. In some embodiments, the glass layer 22 has a thickness of 3 mm to 3.5 mm. In some embodiments, the glass layer 22 has a thickness of 3.1 mm to 3.5 mm. In some embodiments, the glass layer 22 has a thickness of 3.2 mm to 3.5 mm. In some embodiments, the glass layer 22 has a thickness of 3.3 mm to 3.5 mm. In some embodiments, the glass layer 22 has a thickness of 3.4 mm to 3.5 mm. In some embodiments, the glass layer 22 has a thickness of 2.5 mm to 3.4 mm. In some embodiments, the glass layer 22 has a thickness of 2.5 mm to 3.3 mm. In some embodiments, the glass layer 22 has a thickness of 2.5 mm to 3.2 mm. In some embodiments, the glass layer 22 has a thickness of 2.5 mm to 3.1 mm. In some embodiments, the glass layer 22 has a thickness of 2.5 mm to 2.9 mm. In some embodiments, the glass layer 22 has a thickness of 2.5 mm to 2.8 mm. In some embodiments, the glass layer 22 has a thickness of 2.5 mm to 2.7 mm. In some embodiments, the glass layer 22 has a thickness of 2.5 mm to 2.6 mm.

In some embodiments, the glass layer 22 has a thickness of 2.5 mm. In some embodiments, the glass layer 22 has a thickness of 2.6 mm. In some embodiments, the glass layer 22 has a thickness of 2.7 mm. In some embodiments, the glass layer 22 has a thickness of 2.8 mm. In some embodiments, the glass layer 22 has a thickness of 2.9 mm. In some embodiments, the glass layer 22 has a thickness of 3 mm. In some embodiments, the glass layer 22 has a thickness of 3.1 mm. In some embodiments, the glass layer 22 has a thickness of 3.2 mm. In some embodiments, the glass layer 22 has a thickness of 3.3 mm. In some embodiments, the glass layer 22 has a thickness of 3.4 mm. In some embodiments, the glass layer 22 has a thickness of 3.5 mm. In some embodiments, the glass layer 22 has a thickness of 3.6 mm. In some embodiments, the glass layer 22 has a thickness of 3.7 mm. In some embodiments, the glass layer 22 has a thickness of 3.8 mm. In some embodiments, the glass layer 22 has a thickness of 3.9 mm. In some embodiments, the glass layer 22 has a thickness of 4 mm.

In some embodiments, the adhesive layer 26 includes thermosetting polyolefin, thermosetting polyolefin encapsulant material, thermosetting ethylene-vinyl acetate (EVA), EVA encapsulants, thermoplastic olefin, thermoplastic polyolefin (TPO) or hybrids/combinations thereof.

In some embodiments, the adhesive layer 26 has a thickness of 1 µm to 900 µm. In some embodiments, the adhesive layer 26 has a thickness of 1 µm to 900 µm. In some embodiments, the adhesive layer 26 has a thickness of 1 µm to 850 µm. In some embodiments, the adhesive layer 26 has a thickness of 1 µm to 800 µm. In some embodiments, the adhesive layer 26 has a thickness of 1 µm to 750 µm. In some embodiments, the adhesive layer 26 has a thickness of 1 µm to 700 µm. In some embodiments, the adhesive layer 26 has a thickness of 1 µm to 650 µm. In some embodiments, the adhesive layer 26 has a thickness of 1 µm to 600 µm. In some embodiments, the adhesive layer 26 has a thickness of 1 µm to 550 µm. In some embodiments, the adhesive layer 26 has a thickness of 1 µm to 500 µm. In some embodiments, the adhesive layer 26 has a thickness of 1 µm to 450 µm. In some embodiments, the adhesive layer 26 has a thickness of 1 µm to 400 µm. In some embodiments, the adhesive layer 26 has a thickness of 1 µm to 350 µm. In some embodiments, the adhesive layer 26 has a thickness of 1 µm to 300 µm. In some embodiments, the adhesive layer 26 has a thickness of 1 µm to 250 µm. In some embodiments, the adhesive layer 26 has a thickness of 1 µm to 200 µm. In some embodiments, the adhesive layer 26 has a thickness of 1 µm to 150 µm. In some embodiments, the adhesive layer 26 has a thickness of 1 µm to 100 µm. In some embodiments, the adhesive layer 26 has a thickness of 1 µm to 50 µm.

In some embodiments, the adhesive layer 26 has a thickness of 50 µm to 900 µm. In some embodiments, the adhesive layer 26 has a thickness of 50 µm to 850 µm. In some embodiments, the adhesive layer 26 has a thickness of 50 µm to 800 µm. In some embodiments, the adhesive layer 26 has a thickness of 50 µm to 750 µm. In some embodiments, the adhesive layer 26 has a thickness of 50 µm to 700 µm. In some embodiments, the adhesive layer 26 has a thickness of 50 µm to 650 µm. In some embodiments, the adhesive layer 26 has a thickness of 50 µm to 600 µm. In some embodiments, the adhesive layer 26 has a thickness of 50 µm to 550 µm. In some embodiments, the adhesive layer 26 has a thickness of 50 µm to 500 µm. In some embodiments, the adhesive layer 26 has a thickness of 50 µm to 450 µm. In some embodiments, the adhesive layer 26 has a thickness of 50 µm to 400 µm. In some embodiments, the adhesive layer 26 has a thickness of 50 µm to 350 µm. In some embodiments, the adhesive layer 26 has a thickness of 50 µm to 300 µm. In some embodiments, the adhesive layer 26 has a thickness of 50 µm to 250 µm. In some embodiments, the adhesive layer 26 has a thickness of 50 µm to 200 µm. In some embodiments, the adhesive layer 26 has a thickness of 50 μm to 150 μm. In some embodiments, the adhesive layer 26 has a thickness of 50 μm to 100 μm.

In some embodiments, the adhesive layer 26 has a thickness of 100 μm to 900 μm. In some embodiments, the adhesive layer 26 has a thickness of 100 μm to 850 μm. In some embodiments, the adhesive layer 26 has a thickness of 100 μm to 800 μm. In some embodiments, the adhesive layer 26 has a thickness of 100 μm to 750 μm. In some embodiments, the adhesive layer 26 has a thickness of 100 μm to 700 μm. In some embodiments, the adhesive layer 26 has a thickness of 100 μm to 650 μm. In some embodiments, the adhesive layer 26 has a thickness of 100 μm to 600 μm. In some embodiments, the adhesive layer 26 has a thickness of 100 μm to 550 μm. In some embodiments, the adhesive layer 26 has a thickness of 100 μm to 500 μm. In some embodiments, the adhesive layer 26 has a thickness of 100 μm to 450 μm. In some embodiments, the adhesive layer 26 has a thickness of 100 μm to 400 μm. In some embodiments, the adhesive layer 26 has a thickness of 100 μm to 350 μm. In some embodiments, the adhesive layer 26 has a thickness of 100 μm to 300 μm. In some embodiments, the adhesive layer 26 has a thickness of 100 μm to 250 μm. In some embodiments, the adhesive layer 26 has a thickness of 100 μm to 200 μm. In some embodiments, the adhesive layer 26 has a thickness of 100 μm to 150 μm.

In some embodiments, the adhesive layer 26 has a thickness of 150 μm to 900 μm. In some embodiments, the adhesive layer 26 has a thickness of 150 μm to 850 μm. In some embodiments, the adhesive layer 26 has a thickness of 150 μm to 800 μm. In some embodiments, the adhesive layer 26 has a thickness of 150 μm to 750 μm. In some embodiments, the adhesive layer 26 has a thickness of 150 μm to 700 μm. In some embodiments, the adhesive layer 26 has a thickness of 150 μm to 650 μm. In some embodiments, the adhesive layer 26 has a thickness of 150 μm to 600 μm. In some embodiments, the adhesive layer 26 has a thickness of 150 μm to 550 μm. In some embodiments, the adhesive layer 26 has a thickness of 150 μm to 500 μm. In some embodiments, the adhesive layer 26 has a thickness of 150 μm to 450 μm. In some embodiments, the adhesive layer 26 has a thickness of 150 μm to 400 μm. In some embodiments, the adhesive layer 26 has a thickness of 150 μm to 350 μm. In some embodiments, the adhesive layer 26 has a thickness of 150 μm to 300 μm. In some embodiments, the adhesive layer 26 has a thickness of 150 μm to 250 μm. In some embodiments, the adhesive layer 26 has a thickness of 150 μm to 200 μm.

In some embodiments, the adhesive layer 26 has a thickness of 200 μm to 900 μm. In some embodiments, the adhesive layer 26 has a thickness of 200 μm to 850 μm. In some embodiments, the adhesive layer 26 has a thickness of 200 μm to 800 μm. In some embodiments, the adhesive layer 26 has a thickness of 200 μm to 750 μm. In some embodiments, the adhesive layer 26 has a thickness of 200 μm to 700 μm. In some embodiments, the adhesive layer 26 has a thickness of 200 μm to 650 μm. In some embodiments, the adhesive layer 26 has a thickness of 200 μm to 600 μm. In some embodiments, the adhesive layer 26 has a thickness of 200 μm to 550 μm. In some embodiments, the adhesive layer 26 has a thickness of 200 μm to 500 μm. In some embodiments, the adhesive layer 26 has a thickness of 200 μm to 450 μm. In some embodiments, the adhesive layer 26 has a thickness of 200 μm to 400 μm. In some embodiments, the adhesive layer 26 has a thickness of 200 μm to 350 μm. In some embodiments, the adhesive layer 26 has a thickness of 200 μm to 300 μm. In some embodiments, the adhesive layer 26 has a thickness of 200 μm to 250 μm.

In some embodiments, the adhesive layer 26 has a thickness of 250 μm to 900 μm. In some embodiments, the adhesive layer 26 has a thickness of 250 μm to 850 μm. In some embodiments, the adhesive layer 26 has a thickness of 250 μm to 800 μm. In some embodiments, the adhesive layer 26 has a thickness of 250 μm to 750 μm. In some embodiments, the adhesive layer 26 has a thickness of 250 μm to 700 μm. In some embodiments, the adhesive layer 26 has a thickness of 250 μm to 650 μm. In some embodiments, the adhesive layer 26 has a thickness of 250 μm to 600 μm. In some embodiments, the adhesive layer 26 has a thickness of 250 μm to 550 μm. In some embodiments, the adhesive layer 26 has a thickness of 250 μm to 500 μm. In some embodiments, the adhesive layer 26 has a thickness of 250 μm to 450 μm. In some embodiments, the adhesive layer 26 has a thickness of 250 μm to 400 μm. In some embodiments, the adhesive layer 26 has a thickness of 250 μm to 350 μm. In some embodiments, the adhesive layer 26 has a thickness of 250 μm to 300 μm.

In some embodiments, the adhesive layer 26 has a thickness of 300 μm to 900 μm. In some embodiments, the adhesive layer 26 has a thickness of 300 μm to 850 μm. In some embodiments, the adhesive layer 26 has a thickness of 300 μm to 800 μm. In some embodiments, the adhesive layer 26 has a thickness of 300 μm to 750 μm. In some embodiments, the adhesive layer 26 has a thickness of 300 μm to 700 μm. In some embodiments, the adhesive layer 26 has a thickness of 300 μm to 650 μm. In some embodiments, the adhesive layer 26 has a thickness of 300 μm to 600 μm. In some embodiments, the adhesive layer 26 has a thickness of 300 μm to 550 μm. In some embodiments, the adhesive layer 26 has a thickness of 300 μm to 500 μm. In some embodiments, the adhesive layer 26 has a thickness of 300 μm to 450 μm. In some embodiments, the adhesive layer 26 has a thickness of 300 μm to 400 μm. In some embodiments, the adhesive layer 26 has a thickness of 300 μm to 350 μm.

In some embodiments, the adhesive layer 26 has a thickness of 350 μm to 900 μm. In some embodiments, the adhesive layer 26 has a thickness of 350 μm to 850 μm. In some embodiments, the adhesive layer 26 has a thickness of 350 μm to 800 μm. In some embodiments, the adhesive layer 26 has a thickness of 350 μm to 750 μm. In some embodiments, the adhesive layer 26 has a thickness of 350 μm to 700 μm. In some embodiments, the adhesive layer 26 has a thickness of 350 μm to 650 μm. In some embodiments, the adhesive layer 26 has a thickness of 350 μm to 600 μm. In some embodiments, the adhesive layer 26 has a thickness of 350 μm to 550 μm. In some embodiments, the adhesive layer 26 has a thickness of 350 μm to 500 μm. In some embodiments, the adhesive layer 26 has a thickness of 350 μm to 450 μm. In some embodiments, the adhesive layer 26 has a thickness of 350 μm to 400 μm.

In some embodiments, the adhesive layer 26 has a thickness of 400 μm to 900 μm. In some embodiments, the adhesive layer 26 has a thickness of 400 μm to 850 μm. In some embodiments, the adhesive layer 26 has a thickness of 400 μm to 800 μm. In some embodiments, the adhesive layer 26 has a thickness of 400 μm to 750 μm. In some embodiments, the adhesive layer 26 has a thickness of 400 μm to 700 μm. In some embodiments, the adhesive layer 26 has a thickness of 400 μm to 650 μm. In some embodiments, the adhesive layer 26 has a thickness of 400 μm to 600 μm. In some embodiments, the adhesive layer 26 has a thickness of 400 μm to 550 μm. In some embodiments, the adhesive layer 26 has a thickness of 400 μm to 500 μm. In some embodiments, the adhesive layer 26 has a thickness of 400 μm to 450 μm.

In some embodiments, the adhesive layer 26 has a thickness of 450 μm to 900 μm. In some embodiments, the adhesive layer 26 has a thickness of 450 μm to 850 μm. In some embodiments, the adhesive layer 26 has a thickness of 450 μm to 800 μm. In some embodiments, the adhesive layer 26 has a thickness of 450 μm to 750 μm. In some embodiments, the adhesive layer 26 has a thickness of 450 μm to 700 μm. In some embodiments, the adhesive layer 26 has a thickness of 450 μm to 650 μm. In some embodiments, the adhesive layer 26 has a thickness of 450 μm to 600 μm. In some embodiments, the adhesive layer 26 has a thickness of 450 μm to 550 μm. In some embodiments, the adhesive layer 26 has a thickness of 450 μm to 500 μm.

In some embodiments, the adhesive layer 26 has a thickness of 500 μm to 900 μm. In some embodiments, the adhesive layer 26 has a thickness of 500 μm to 850 μm. In some embodiments, the adhesive layer 26 has a thickness of 500 μm to 800 μm. In some embodiments, the adhesive layer 26 has a thickness of 500 μm to 750 μm. In some embodiments, the adhesive layer 26 has a thickness of 500 μm to 700 μm. In some embodiments, the adhesive layer 26 has a thickness of 500 μm to 650 μm. In some embodiments, the adhesive layer 26 has a thickness of 500 μm to 600 μm. In some embodiments, the adhesive layer 26 has a thickness of 500 μm to 550 μm.

In some embodiments, the adhesive layer 26 has a thickness of 550 μm to 900 μm. In some embodiments, the adhesive layer 26 has a thickness of 550 μm to 850 μm. In some embodiments, the adhesive layer 26 has a thickness of 550 μm to 800 μm. In some embodiments, the adhesive layer 26 has a thickness of 550 μm to 750 μm. In some embodiments, the adhesive layer 26 has a thickness of 550 μm to 700 μm. In some embodiments, the adhesive layer 26 has a thickness of 550 μm to 650 μm. In some embodiments, the adhesive layer 26 has a thickness of 550 μm to 600 μm.

In some embodiments, the adhesive layer 26 has a thickness of 600 μm to 900 μm. In some embodiments, the adhesive layer 26 has a thickness of 600 μm to 850 μm. In some embodiments, the adhesive layer 26 has a thickness of 600 μm to 800 μm. In some embodiments, the adhesive layer 26 has a thickness of 600 μm to 750 μm. In some embodiments, the adhesive layer 26 has a thickness of 600 μm to 700 μm. In some embodiments, the adhesive layer 26 has a thickness of 600 μm to 650 μm.

In some embodiments, the adhesive layer 26 has a thickness of 650 μm to 900 μm. In some embodiments, the adhesive layer 26 has a thickness of 650 μm to 850 μm. In some embodiments, the adhesive layer 26 has a thickness of 650 μm to 800 μm. In some embodiments, the adhesive layer 26 has a thickness of 650 μm to 750 μm. In some embodiments, the adhesive layer 26 has a thickness of 650 μm to 700 μm. In some embodiments, the adhesive layer 26 has a thickness of 700 μm to 900 μm. In some embodiments, the adhesive layer 26 has a thickness of 700 μm to 850 μm. In some embodiments, the adhesive layer 26 has a thickness of 700 μm to 800 μm. In some embodiments, the adhesive layer 26 has a thickness of 700 μm to 750 μm. In some embodiments, the adhesive layer 26 has a thickness of 750 μm to 900 μm. In some embodiments, the adhesive layer 26 has a thickness of 750 μm to 850 μm. In some embodiments, the adhesive layer 26 has a thickness of 750 μm to 800 μm. In some embodiments, the adhesive layer 26 has a thickness of 800 μm to 900 μm. In some embodiments, the adhesive layer 26 has a thickness of 800 μm to 850 μm. In some embodiments, the adhesive layer 26 has a thickness of 850 μm to 900 μm.

In some embodiments, the adhesive layer 26 has a thickness of 1 μm. In some embodiments, the adhesive layer 26 has a thickness of 50 μm. In some embodiments, the adhesive layer 26 has a thickness of 100 μm. In some embodiments, the adhesive layer 26 has a thickness of 1 μm. In some embodiments, the adhesive layer 26 has a thickness of 150 μm. In some embodiments, the adhesive layer 26 has a thickness of 200 μm. In some embodiments, the adhesive layer 26 has a thickness of 250 μm. In some embodiments, the adhesive layer 26 has a thickness of 300 μm. In some embodiments, the adhesive layer 26 has a thickness of 350 μm. In some embodiments, the adhesive layer 26 has a thickness of 400 μm. In some embodiments, the adhesive layer 26 has a thickness of 450 μm. In some embodiments, the adhesive layer 26 has a thickness of 500 μm. In some embodiments, the adhesive layer 26 has a thickness of 550 μm. In some embodiments, the adhesive layer 26 has a thickness of 600 μm. In some embodiments, the adhesive layer 26 has a thickness of 650 μm. In some embodiments, the adhesive layer 26 has a thickness of 700 μm. In some embodiments, the adhesive layer 26 has a thickness of 750 μm. In some embodiments, the adhesive layer 26 has a thickness of 800 μm. In some embodiments, the adhesive layer 26 has a thickness of 850 μm. In some embodiments, the adhesive layer 26 has a thickness of 900 μm.

In some embodiments, the polymer layer 24 includes a fluoropolymer. In certain embodiments, the fluoropolymer may be ethylene tetrafluoroethylene (ETFE), fluoropolymer is polyvinylidene fluoride (PVDF), tetrafluoroethylene-hexafluoropropylene copolymers (FEP), and tetrafluoroethylene-hexafluoropropylene-vinylidene fluoride copolymers (THV), polyvinyl fluoride (PVF), or blends thereof. In some embodiments, the frontsheet includes fluoropolymers, acrylics, polyesters, silicones, polycarbonates, or combinations thereof. In other embodiments, the polymer layer 24 includes polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), or polyimide. In some embodiments, the polymer layer 24 includes a crosslinked polymeric material. In some embodiments, 50% to 99% of the polymer chains of the polymeric material are crosslinked.

In some embodiments, the polymer layer 24 has a thickness of 0.01 mm to 0.5 mm. In some embodiments, the polymer layer 24 has a thickness of 0.01 mm to 0.4 mm. In some embodiments, the polymer layer 24 has a thickness of 0.01 mm to 0.3 mm. In some embodiments, the polymer layer 24 has a thickness of 0.01 mm to 0.2 mm. In some embodiments, the polymer layer 24 has a thickness of 0.01 mm to 0.1 mm. In some embodiments, the polymer layer 24 has a thickness of 0.01 mm to 0.09 mm. In some embodiments, the polymer layer 24 has a thickness of 0.01 mm to 0.08 mm. In some embodiments, the polymer layer 24 has a thickness of 0.01 mm to 0.07 mm. In some embodiments, the polymer layer 24 has a thickness of 0.01 mm to 0.06 mm. In some embodiments, the polymer layer 24 has a thickness of 0.01 mm to 0.05 mm. In some embodiments, the polymer layer 24 has a thickness of 0.01 mm to 0.04 mm. In some embodiments, the polymer layer 24 has a thickness of 0.01 mm to 0.03 mm. In some embodiments, the polymer layer 24 has a thickness of 0.01 mm to 0.02 mm.

In some embodiments, the polymer layer 24 has a thickness of 0.01 mm to 0.4 mm. In some embodiments, the polymer layer 24 has a thickness of 0.02 mm to 0.4 mm. In some embodiments, the polymer layer 24 has a thickness of 0.03 mm to 0.4 mm. In some embodiments, the polymer layer 24 has a thickness of 0.04 mm to 0.4 mm. In some embodiments, the polymer layer 24 has a thickness of 0.05 mm to 0.4 mm. In some embodiments, the polymer layer 24 has a thickness of 0.06 mm to 0.4 mm. In some embodiments, the polymer layer 24 has a thickness of 0.07 mm to 0.4 mm. In some embodiments, the polymer layer 24 has a thickness of 0.08 mm to 0.4 mm. In some embodiments, the polymer layer 24 has a thickness of 0.09 mm to 0.4 mm. In some embodiments, the polymer layer 24 has a thickness of 0.1 mm to 0.4 mm. In some embodiments, the polymer layer 24 has a thickness of 0.15 mm to 0.4 mm. In some embodiments, the polymer layer 24 has a thickness of 0.2 mm to 0.4 mm. In some embodiments, the polymer layer 24 has a thickness of 0.25 mm to 0.4 mm. In some embodiments, the polymer layer 24 has a thickness of 0.3 mm to 0.4 mm. In some embodiments, the polymer layer 24 has a thickness of 0.35 mm to 0.4 mm.

In some embodiments, the polymer layer 24 has a thickness of 0.025 mm to 0.1 mm. In some embodiments, the polymer layer 24 has a thickness of 0.03 mm to 0.1 mm. In some embodiments, the polymer layer 24 has a thickness of 0.035 mm to 0.1 mm. In some embodiments, the polymer layer 24 has a thickness of 0.04 mm to 0.1 mm. In some embodiments, the polymer layer 24 has a thickness of 0.045 mm to 0.1 mm. In some embodiments, the polymer layer 24 has a thickness of 0.05 mm to 0.1 mm. In some embodiments, the polymer layer 24 has a thickness of 0.06 mm to 0.1 mm. In some embodiments, the polymer layer 24 has a thickness of 0.065 mm to 0.1 mm. In some embodiments, the polymer layer 24 has a thickness of 0.07 mm to 0.1 mm. In some embodiments, the polymer layer 24 has a thickness of 0.075 mm to 0.1 mm. In some embodiments, the polymer layer 24 has a thickness of 0.08 mm to 0.1 mm. In some embodiments, the polymer layer 24 has a thickness of 0.085 mm to 0.1 mm. In some embodiments, the polymer layer 24 has a thickness of 0.09 mm to 0.1 mm. In some embodiments, the polymer layer 24 has a thickness of 0.095 mm to 0.1 mm.

In some embodiments, the frontsheet 16 includes only the glass layer 22. In some embodiments, the frontsheet 16 includes only the polymer layer 24.

Referring to FIGS. 1, 3A and 3B, in some embodiments, a backsheet 28 is juxtaposed with a second surface of the encapsulant 14. In some embodiments, the backsheet 28 includes a first surface 30, a second surface 32 opposite the first surface 30, a first side 34, a second side 36 opposite the first side 34, a first edge 38 extending from the first side 34 to the second side 36, and a second edge 40 opposite the first edge 38 and extending from the first side 34 to the second side 36.

In some embodiments, the backsheet 28 includes a first section 42 and a second section 44. In some embodiments, the first section 42 is transparent. In some embodiments, the second section 44 is non-transparent (opaque). In some embodiments, the first section 42 extends from the first edge 38 to a first location 46 intermediate the first edge 38 and the second edge 40. In some embodiments, the first section 42 extends from the first edge 38 to the first location 46 and from the first side 34 to the second side 36. In some embodiments, the first section 42 extends from the first edge 38 to the first location 46, from the first side 34 to the second side 36, and from the first surface 30 to the second surface 32. In some embodiments, the second section 44 extends from the first location 46 to the second edge 40. In some embodiments, the second section 44 extends from the first location 46 to the second edge 40 and from the first side 34 to the second side 36. In some embodiments, the second section 44 extends from the first location 46 to the second edge 40, from the first side 34 to the second side 36, and from the first surface 30 to the second surface 32.

In some embodiments, the first section 42 includes a width W1 measured from the first edge 38 to the first location 46. In some embodiments, the width W1 is 5 mm to 30 mm. In some embodiments, the width W1 is 5 mm to 25 mm. In some embodiments, the width W1 is 5 mm to 20 mm. In some embodiments, the width W1 is 5 mm to 15 mm. In some embodiments, the width W1 is 5 mm to 10 mm. In some embodiments, the width W1 is 10 mm to 30 mm. In some embodiments, the width W1 is 10 mm to 25 mm. In some embodiments, the width W1 is 10 mm to 20 mm. In some embodiments, the width W1 is 10 mm to 15 mm. In some embodiments, the width W1 is 15 mm to 30 mm. In some embodiments, the width W1 is 15 mm to 25 mm. In some embodiments, the width W1 is 15 mm to 20 mm. In some embodiments, the width W1 is 20 mm to 30 mm. In some embodiments, the width W1 is 20 mm to 25 mm. In some embodiments, the width W1 is 25 mm to 30 mm. In some embodiments, the width W1 is 5 mm. In some embodiments, the width W1 is 10 mm. In some embodiments, the width W1 is 15 mm. In some embodiments, the width W1 is 20 mm. In some embodiments, the width W1 is 25 mm. In some embodiments, the width W1 is 30 mm.

Referring to FIG. 3B, in some embodiments, the backsheet 28 includes a third section 48 that extends from the second edge 40 to a second location 50 intermediate the second edge 40 and the first edge 38. In some embodiments, the third section 48 extends from the second edge 40 to the second location 50 and from the first side 34 to the second side 36. In some embodiments, the third section 48 extends from the second edge 40 to the second location 50, from the first side 34 to the second side 36, and from the first surface 30 to the second surface 32.

In some embodiments, the second section 44 extends from the first location 46 to the second location 50. In some embodiments, the second section 44 extends from the first location 46 to the second location 50 and from the first side 34 to the second side 36. In some embodiments, the second section 44 extends from the first location 46 to the second location 50, from the first side 34 to the second side 36, and from the first surface 30 to the second surface 32.

In some embodiments, the backsheet 28 includes thermoplastic polyolefin (TPO). In some embodiments, the backsheet 28 includes a single ply TPO roofing membrane. In other embodiments, non-limiting examples of TPO membranes are disclosed in U.S. Pat. No. 9,359,014 to Yang et al., which is incorporated by reference herein in its entirety. In some embodiments, the backsheet 28 includes polyvinyl chloride. In some embodiments, the backsheet 28 includes ethylene propylene diene monomer (EPDM) rubber. In some embodiments, the backsheet 28 includes a flame retardant additive. In some embodiments, the flame retardant additive may be clays, nanoclays, silicas, carbon black, metal hydroxides such as aluminum hydroxide, metal foils, graphite, and combinations thereof. In some embodiments, the backsheet 28 includes polyethylene terephthalate (PET). In some embodiments, the backsheet 28 includes ethylene tetrafluoroethylene (ETFE). In some embodiments, the backsheet 28 includes tetrafluoroethylene-hexafluoropropylene copolymers (FEP). In some embodiments, the backsheet 28 includes ethylene chlorotrifluoroethylene (ECTFE).

In some embodiments, the backsheet 28 has a thickness of 2 mil to 100 mil. In some embodiments, the backsheet 28 has a thickness of 2 mil to 90 mil. In some embodiments, the backsheet 28 has a thickness of 2 mil to 80 mil. In some embodiments, the backsheet 28 has a thickness of 2 mil to 70 mil. In some embodiments, the backsheet 28 has a thickness of 2 mil to 60 mil. In some embodiments, the backsheet 28 has a thickness of 2 mil to 50 mil. In some embodiments, the backsheet 28 has a thickness of 2 mil to 40 mil. In some embodiments, the backsheet 28 has a thickness of 2 mil to 30 mil. In some embodiments, the backsheet 28 has a thickness of 2 mil to 20 mil. In some embodiments, the backsheet 28 has a thickness of 2 mil to 10 mil. In some embodiments, the backsheet 28 has a thickness of 10 mil to 100 mil. In some embodiments, the backsheet 28 has a thickness of 10 mil to 90 mil. In some embodiments, the backsheet 28 has a thickness of 10 mil to 80 mil. In some embodiments, the backsheet 28 has a thickness of 10 mil to 70 mil. In some embodiments, the backsheet 28 has a thickness of 10 mil to 60 mil. In some embodiments, the backsheet 28 has a thickness of 10 mil to 50 mil. In some embodiments, the backsheet 28 has a thickness of 10 mil to 40 mil. In some embodiments, the backsheet 28 has a thickness of 10 mil to 30 mil. In some embodiments, the backsheet 28 has a thickness of 10 mil to 20 mil.

In some embodiments, the backsheet 28 has a thickness of 20 mil to 100 mil. In some embodiments, the backsheet 28 has a thickness of 20 mil to 90 mil. In some embodiments, the backsheet 28 has a thickness of 20 mil to 80 mil. In some embodiments, the backsheet 28 has a thickness of 20 mil to 70 mil. In some embodiments, the backsheet 28 has a thickness of 20 mil to 60 mil. In some embodiments, the backsheet 28 has a thickness of 20 mil to 50 mil. In some embodiments, the backsheet 28 has a thickness of 20 mil to 40 mil. In some embodiments, the backsheet 28 has a thickness of 20 mil to 30 mil. In some embodiments, the backsheet 28 has a thickness of 30 mil to 100 mil. In some embodiments, the backsheet 28 has a thickness of 30 mil to 90 mil. In some embodiments, the backsheet 28 has a thickness of 30 mil to 80 mil. In some embodiments, the backsheet 28 has a thickness of 30 mil to 70 mil. In some embodiments, the backsheet 28 has a thickness of 30 mil to 60 mil. In some embodiments, the backsheet 28 has a thickness of 30 mil to 50 mil. In some embodiments, the backsheet 28 has a thickness of 30 mil to 40 mil.

In some embodiments, the backsheet 28 has a thickness of 40 mil to 100 mil. In some embodiments, the backsheet 28 has a thickness of 40 mil to 90 mil. In some embodiments, the backsheet 28 has a thickness of 40 mil to 80 mil. In some embodiments, the backsheet 28 has a thickness of 40 mil to 70 mil. In some embodiments, the backsheet 28 has a thickness of 40 mil to 60 mil. In some embodiments, the backsheet 28 has a thickness of 40 mil to 50 mil. In some embodiments, the backsheet 28 has a thickness of 50 mil to 100 mil. In some embodiments, the backsheet 28 has a thickness of 50 mil to 90 mil. In some embodiments, the backsheet 28 has a thickness of 50 mil to 80 mil. In some embodiments, the backsheet 28 has a thickness of 50 mil to 70 mil. In some embodiments, the backsheet 28 has a thickness of 50 mil to 60 mil.

In some embodiments, the backsheet 28 has a thickness of 60 mil to 100 mil. In some embodiments, the backsheet 28 has a thickness of 60 mil to 90 mil. In some embodiments, the backsheet 28 has a thickness of 60 mil to 80 mil. In some embodiments, the backsheet 28 has a thickness of 60 mil to 70 mil. In some embodiments, the backsheet 28 has a thickness of 70 mil to 100 mil. In some embodiments, the backsheet 28 has a thickness of 70 mil to 90 mil. In some embodiments, the backsheet 28 has a thickness of 70 mil to 80 mil. In some embodiments, the backsheet 28 has a thickness of 80 mil to 100 mil. In some embodiments, the backsheet 28 has a thickness of 80 mil to 90 mil. In some embodiments, the backsheet 28 has a thickness of 90 mil to 100 mil.

In some embodiments, the backsheet 28 has a thickness of 2 mil. In some embodiments, the backsheet 28 has a thickness of 10 mil. In some embodiments, the backsheet 28 has a thickness of 20 mil. In some embodiments, the backsheet 28 has a thickness of 30 mil. In some embodiments, the backsheet 28 has a thickness of 40 mil. In some embodiments, the backsheet 28 has a thickness of 50 mil. In some embodiments, the backsheet 28 has a thickness of 60 mil. In some embodiments, the backsheet 28 has a thickness of 10 mil. In some embodiments, the backsheet 28 has a thickness of 70 mil. In some embodiments, the backsheet 28 has a thickness of 80 mil. In some embodiments, the backsheet 28 has a thickness of 90 mil. In some embodiments, the backsheet 28 has a thickness of 100 mil.

In some embodiments, the second section 44 of the backsheet 28 is painted. In some embodiments, the second section 44 of the backsheet 28 is painted an opaque color. In some embodiments, the second section 44 of the backsheet 28 includes an opaque color printed thereon.

Referring to FIG. 1, in some embodiments, the photovoltaic module 10 includes an adhesive 52. In some embodiments, the adhesive 52 is attached to the second surface 32 of the backsheet 28. In some embodiments, the adhesive 52 is transparent. In some embodiments, the adhesive 52 is located proximate to the first section 42. In some embodiments, the adhesive 52 is juxtaposed with the first section 42. In some embodiments, edges 54a, 54b of the adhesive 52 are substantially aligned with corresponding edges 56a, 56b of the first section 42. In some embodiments, the edges 54a, 54b of the adhesive 52 are aligned with the edges 56a, 56b of the first section 42.

In some embodiments, the adhesive 52 is located proximate to the third section 48. In some embodiments, the adhesive 52 is juxtaposed with the third section 48. In some embodiments, the edges 54a, 54b of the adhesive 52 are substantially aligned with edges 58a, 58b of the third section 48. In some embodiments, the edges 54a, 54b of the adhesive 52 are aligned with the edges 58a, 58b of the third section 48.

In some embodiments, the adhesive 52 is silicone. In some embodiments, the adhesive 52 is a tape. In some embodiments, the adhesive 52 is VHB tape supplied by 3M. In some embodiments, the adhesive 52 is an acrylic adhesive. In some embodiments, the adhesive 52 is a urethane adhesive. In some embodiments, the adhesive 52 is an epoxy. In some embodiments, the adhesive 52 is butyl. In some embodiments, the adhesive 52 is a poly-vinyl acetate (PVA) adhesive.

In some embodiments, the adhesive 52 is applied to the photovoltaic module 10 during the manufacture thereof. In some embodiments, the adhesive 52 is applied to the photovoltaic module 10 during the installation of the photovoltaic module 10 on a roof deck.

In some embodiments, the adhesive 52 has a thickness of 1 mil to 100 mil. In some embodiments, the adhesive 52 has a thickness of 1 mil to 90 mil. In some embodiments, the adhesive 52 has a thickness of 1 mil to 80 mil. In some embodiments, the adhesive 52 has a thickness of 1 mil to 70 mil. In some embodiments, the adhesive 52 has a thickness of 1 mil to 60 mil. In some embodiments, the adhesive 52 has a thickness of 1 mil to 50 mil. In some embodiments, the adhesive 52 has a thickness of 1 mil to 40 mil. In some embodiments, the adhesive 52 has a thickness of 1 mil to 30 mil. In some embodiments, the adhesive 52 has a thickness of 1 mil to 20 mil. In some embodiments, the adhesive 52 has a thickness of 1 mil to 10 mil.

In some embodiments, the adhesive 52 has a thickness of 10 mil to 100 mil. In some embodiments, the adhesive 52 has a thickness of 10 mil to 90 mil. In some embodiments, the adhesive 52 has a thickness of 10 mil to 80 mil. In some embodiments, the adhesive 52 has a thickness of 10 mil to 70 mil. In some embodiments, the adhesive 52 has a thickness of 10 mil to 60 mil. In some embodiments, the adhesive 52 has a thickness of 10 mil to 50 mil. In some embodiments, the adhesive 52 has a thickness of 10 mil to 40 mil. In some embodiments, the adhesive 52 has a thickness of 10 mil to 30 mil. In some embodiments, the adhesive 52 has a thickness of 10 mil to 20 mil.

In some embodiments, the adhesive 52 has a thickness of 20 mil to 100 mil. In some embodiments, the adhesive 52 has a thickness of 20 mil to 90 mil. In some embodiments, the adhesive 52 has a thickness of 20 mil to 80 mil. In some embodiments, the adhesive 52 has a thickness of 20 mil to 70 mil. In some embodiments, the adhesive 52 has a thickness of 20 mil to 60 mil. In some embodiments, the adhesive 52 has a thickness of 20 mil to 50 mil. In some embodiments, the adhesive 52 has a thickness of 20 mil to 40 mil. In some embodiments, the adhesive 52 has a thickness of 20 mil to 30 mil.

In some embodiments, the adhesive 52 has a thickness of 30 mil to 100 mil. In some embodiments, the adhesive 52 has a thickness of 30 mil to 90 mil. In some embodiments, the adhesive 52 has a thickness of 30 mil to 80 mil. In some embodiments, the adhesive 52 has a thickness of 30 mil to 70 mil. In some embodiments, the adhesive 52 has a thickness of 30 mil to 60 mil. In some embodiments, the adhesive 52 has a thickness of 30 mil to 50 mil. In some embodiments, the adhesive 52 has a thickness of 30 mil to 40 mil.

In some embodiments, the adhesive 52 has a thickness of 40 mil to 100 mil. In some embodiments, the adhesive 52 has a thickness of 40 mil to 90 mil. In some embodiments, the adhesive 52 has a thickness of 40 mil to 80 mil. In some embodiments, the adhesive 52 has a thickness of 40 mil to 70 mil. In some embodiments, the adhesive 52 has a thickness of 40 mil to 60 mil. In some embodiments, the adhesive 52 has a thickness of 40 mil to 50 mil. In some embodiments, the adhesive 52 has a thickness of 50 mil to 100 mil. In some embodiments, the adhesive 52 has a thickness of 50 mil to 90 mil. In some embodiments, the adhesive 52 has a thickness of 50 mil to 80 mil. In some embodiments, the adhesive 52 has a thickness of 50 mil to 70 mil. In some embodiments, the adhesive 52 has a thickness of 50 mil to 60 mil.

In some embodiments, the adhesive 52 has a thickness of 60 mil to 100 mil. In some embodiments, the adhesive 52 has a thickness of 60 mil to 90 mil. In some embodiments, the adhesive 52 has a thickness of 60 mil to 80 mil. In some embodiments, the adhesive 52 has a thickness of 60 mil to 70 mil. In some embodiments, the adhesive 52 has a thickness of 70 mil to 100 mil. In some embodiments, the adhesive 52 has a thickness of 70 mil to 90 mil. In some embodiments, the adhesive 52 has a thickness of 70 mil to 80 mil. In some embodiments, the adhesive 52 has a thickness of 80 mil to 100 mil. In some embodiments, the adhesive 52 has a thickness of 80 mil to 90 mil. In some embodiments, the adhesive 52 has a thickness of 90 mil to 100 mil.

In some embodiments, the adhesive 52 has a thickness of 1 mil. In some embodiments, the adhesive 52 has a thickness of 10 mil. In some embodiments, the adhesive 52 has a thickness of 20 mil. In some embodiments, the adhesive 52 has a thickness of 30 mil. In some embodiments, the adhesive 52 has a thickness of 40 mil. In some embodiments, the adhesive 52 has a thickness of 50 mil. In some embodiments, the adhesive 52 has a thickness of 60 mil. In some embodiments, the adhesive 52 has a thickness of 70 mil. In some embodiments, the adhesive 52 has a thickness of 80 mil. In some embodiments, the adhesive 52 has a thickness of 90 mil. In some embodiments, the adhesive 52 has a thickness of 100 mil.

In some embodiments, the adhesive 52 optically couples the photovoltaic module 10 with another photovoltaic module. In some embodiments, the adhesive 52 mechanically couples the photovoltaic module 10 with another photovoltaic module overlayed by the photovoltaic module 10. As used herein and with respect to certain embodiments of the photovoltaic module 10, the term "optically couples" means each of a first photovoltaic module and a second photovoltaic module include a structure and an installed position such that solar light is capable of being transmitted through the first photovoltaic module to the second photovoltaic module.

In some embodiments, the adhesive 52 has a solar weighted transmission of 50% to 100%. In some embodiments, the adhesive 52 has a solar weighted transmission of 50% to 95%. In some embodiments, the adhesive 52 has a solar weighted transmission of 50% to 90%. In some embodiments, the adhesive 52 has a solar weighted transmission of 50% to 80%. In some embodiments, the adhesive 52 has a solar weighted transmission of 50% to 70%. In some embodiments, the adhesive 52 has a solar weighted transmission of 50% to 60%. In some embodiments, the adhesive 52 has a solar weighted transmission of 60% to 100%. In some embodiments, the adhesive 52 has a solar weighted transmission of 60% to 90%. In some embodiments, the adhesive 52 has a solar weighted transmission of 60% to 80%. In some embodiments, the adhesive 52 has a solar weighted transmission of 60% to 70%. In some embodiments, the adhesive 52 has a solar weighted transmission of 70% to 100%. In some embodiments, the adhesive 52 has a solar weighted transmission of 70% to 90%. In some embodiments, the adhesive 52 has a solar weighted transmission of 70% to 80%. In some embodiments, the adhesive 52 has a solar weighted transmission of 80% to 100%. In some embodiments, the adhesive 52 has a solar weighted transmission of 80% to 90%. In some embodiments, the adhesive 52 has a solar weighted transmission of 90% to 100%.

In some embodiments, the adhesive 52 has a solar weighted transmission of 50%. In some embodiments, the adhesive 52 has a solar weighted transmission of 60%. In some embodiments, the adhesive 52 has a solar weighted transmission of 70%. In some embodiments, the adhesive 52 has a solar weighted transmission of 80%. In some embodiments, the adhesive 52 has a solar weighted transmission of 90%. In some embodiments, the adhesive 52 has a solar weighted transmission of 95%. In some embodiments, the adhesive 52 has a solar weighted transmission of 99.9%. In some embodiments, the adhesive 52 has a solar weighted transmission of 100%.

In some embodiments, the adhesive 52 has an index of refraction of 1 to 1.7. In some embodiments, the adhesive 52 has an index of refraction of 1 to 1.6. In some embodiments, the adhesive 52 has an index of refraction of 1 to 1.5. In some embodiments, the adhesive 52 has an index of refraction of 1 to 1.4. In some embodiments, the adhesive 52 has an index of refraction of 1 to 1.3. In some embodiments, the adhesive 52 has an index of refraction of 1 to 1.2. In some embodiments, the adhesive 52 has an index of refraction of 1 to 1.1.

In some embodiments, the adhesive 52 has an index of refraction of 1.1 to 1.7. In some embodiments, the adhesive 52 has an index of refraction of 1.1 to 1.6. In some embodiments, the adhesive 52 has an index of refraction of 1.1 to 1.5. In some embodiments, the adhesive 52 has an index of refraction of 1.1 to 1.4. In some embodiments, the adhesive 52 has an index of refraction of 1.1 to 1.3. In some embodiments, the adhesive 52 has an index of refraction of 1.1 to 1.2. In some embodiments, the adhesive 52 has an index of refraction of 1.2 to 1.7. In some embodiments, the adhesive 52 has an index of refraction of 1.2 to 1.6. In some embodiments, the adhesive 52 has an index of refraction of 1.2 to 1.5. In some embodiments, the adhesive 52 has an index of refraction of 1.2 to 1.4. In some embodiments, the adhesive 52 has an index of refraction of 1.2 to 1.3.

In some embodiments, the adhesive 52 has an index of refraction of 1.3 to 1.7. In some embodiments, the adhesive 52 has an index of refraction of 1.3 to 1.6. In some embodiments, the adhesive 52 has an index of refraction of 1.3 to 1.5. In some embodiments, the adhesive 52 has an index of refraction of 1.3 to 1.4. In some embodiments, the adhesive 52 has an index of refraction of 1.4 to 1.7. In some embodiments, the adhesive 52 has an index of refraction of 1.4 to 1.6. In some embodiments, the adhesive 52 has an index of refraction of 1.4 to 1.5. In some embodiments, the adhesive 52 has an index of refraction of 1.5 to 1.7. In some embodiments, the adhesive 52 has an index of refraction of 1.5 to 1.6. In some embodiments, the adhesive 52 has an index of refraction of 1.6 to 1.7.

In some embodiments, the adhesive 52 has an index of refraction of 1. In some embodiments, the adhesive 52 has an index of refraction of 1.1. In some embodiments, the adhesive 52 has an index of refraction of 1.2. In some embodiments, the adhesive 52 has an index of refraction of 1.3. In some embodiments, the adhesive 52 has an index of refraction of 1.4. In some embodiments, the adhesive 52 has an index of refraction of 1.5. In some embodiments, the adhesive 52 has an index of refraction of 1.6. In some embodiments, the adhesive 52 has an index of refraction of 1.7.

In some embodiments, at least one solar cell 12 includes a first end 60 and a second end 62 opposite the first end 60. In some embodiments, the first end 60 is located proximate to the first end 18 of the photovoltaic module 10. In some embodiments, the second end 62 is located proximate to the second end 20 of the photovoltaic module 10.

Figure 4:
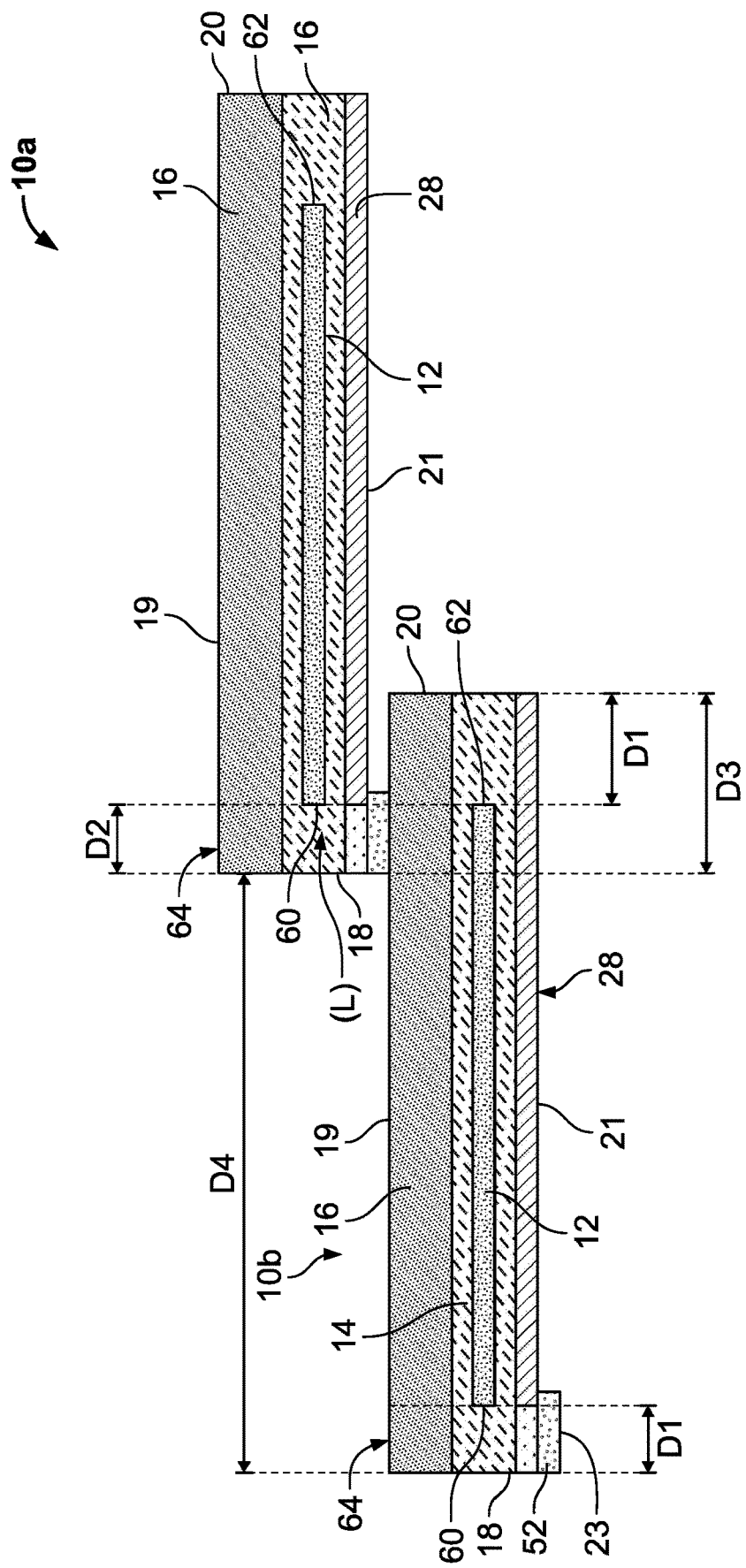
FIG. 4 shows a side schematic view of an embodiment of a system of a plurality of the photovoltaic modules shown in FIG. 1.

Referring to FIG. 4, in some embodiments, a transparent portion 64 (transparent edge) is formed by a portion of the frontsheet 16, a portion of the encapsulant 14, the first section 42 of the backsheet 28, and the adhesive 52. In some embodiments, the transparent portion 64 extends from the first surface 19 to a surface 23 of the adhesive 52. In some embodiments, a creepage distance D1 extends from the first end 18 of the photovoltaic module 10 to the first end 60 of the at least one solar cell 12. In some embodiments, the creepage distance D1 is equal to the width W1 of the first section 42 of the backsheet 28. In some embodiments, the creepage distance D1 extends from the second end 20 of the photovoltaic module 10 to the second end 62 of the at least one solar cell 12.

Figure 5:
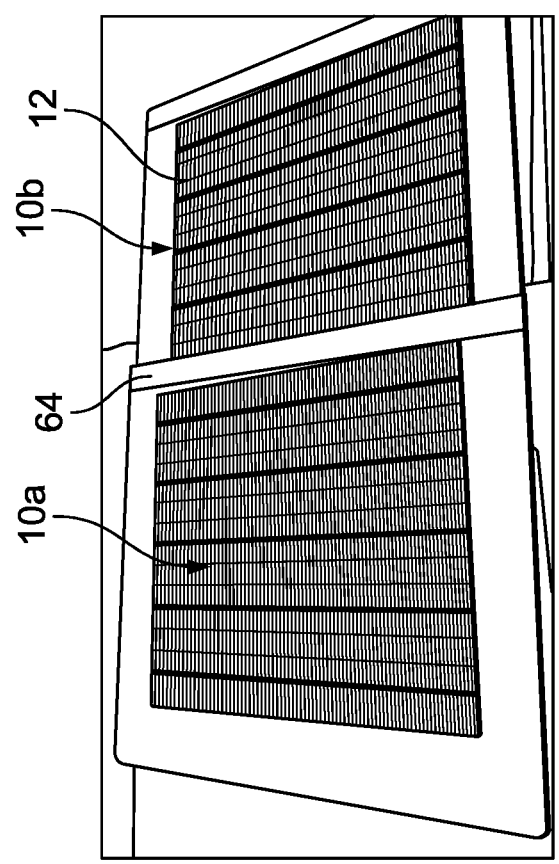
FIG. 5 illustrates an embodiment of photovoltaic modules.
Figure 6:
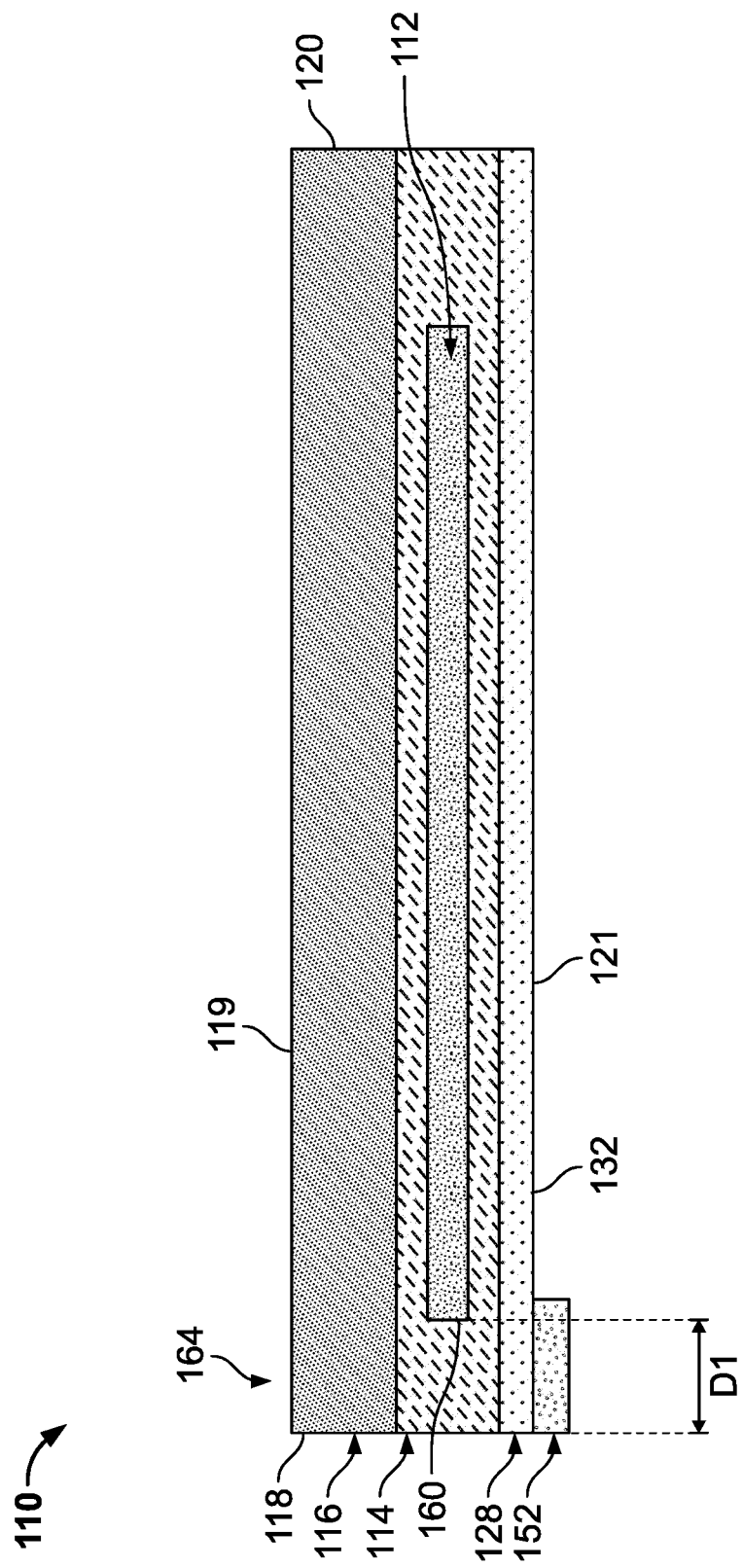
FIG. 6 shows a side schematic view of an embodiment of a photovoltaic module.

Referring to FIGS. 4 through 6, in some embodiments, a system includes a plurality of the photovoltaic modules 10 installed on a roof deck. In some embodiments, the plurality of photovoltaic modules 10 includes a first photovoltaic module 10a and a second photovoltaic module 10b. In some embodiments, a portion of the first photovoltaic module 10a overlays a portion of the second photovoltaic module 10b. In some embodiments, the first end 18 of the first photovoltaic module 10a overlays the second end 20 of the second photovoltaic module 10b. In some embodiments, the transparent portion 64 of the first photovoltaic module 10a overlays a portion of the at least one solar cell 12 at the second end 62 thereof. In some embodiments, the transparent portion 64 overlaps the at least one solar cell 12 at an overlap distance D2. In some embodiments, the overlap distance D2 is equal to the creepage distance D1. In some embodiments, the overlap distance D2 is less than the creepage distance D1. In some embodiments, the adhesive 52 of the first photovoltaic module 10a is attached to the first surface 19 of the second photovoltaic module 10b. In some embodiments, the total amount of overlap D3 of the first photovoltaic module 10a over the second photovoltaic module 10b is twice the creepage distance D1. In some embodiments, the total amount of overlap D3 of the first photovoltaic module 10a over the second photovoltaic module 10b is approximately twice the creepage distance D1. In some embodiments, the reveal D4 of the second photovoltaic module 10b is equal to the length of the at least one solar cell 12. In some embodiments, the reveal D4 of the second photovoltaic module 10b is approximately equal to the length of the at least one solar cell 12.

In some embodiments, solar light transmission L travels through transparent portion 64 (the frontsheet 16, the encapsulant 14, the first section 42 of the backsheet 28 and the adhesive 52) of the first photovoltaic module 10a and through the frontsheet 16 and the encapsulant 14 of the second photovoltaic module 10b to the at least one solar cell 12 of the second photovoltaic module 10b. In some embodiments, a power density (PD) of an array of the photovoltaic modules 10 is relative to the proportion of the area covered by solar cells 12. In some embodiments, the power density (PD) is calculated as:

$$PD = n*S/(2C + n*S)$$

where C=creepage distance D1, S=the length of the at least one solar cell 12, and n=number of the photovoltaic modules 10 in the array. In some embodiments, for relatively large numbers of the photovoltaic modules 10 in the array (for example, with n=10 or greater), the proportion of the total array height covered by the solar cells 12 approaches 100%. In some embodiments, if C=15 mm, S=166 mm, n=10, then PD=98%.

FIG. 6 shows an embodiment of a photovoltaic module 110. The photovoltaic module 110 has a structure and function similar to those of the photovoltaic module 10, with certain differences described below. In some embodiments, the photovoltaic module 110 includes at least one solar cell 112, an encapsulant 114 encapsulating the at least one solar cell 112, a frontsheet 116 juxtaposed with a first surface of the encapsulant 114, and a backsheet 128 juxtaposed with a second surface of the encapsulant 114. In some embodiments, the backsheet 128 is transparent. In some embodiments, the entire area of the backsheet 128 is transparent.

In some embodiments, the photovoltaic module 110 includes an adhesive 152. In some embodiments, the adhesive 152 is attached to a surface 132 of the backsheet 128. In some embodiments, the adhesive 152 is transparent. In some embodiments, the adhesive 152 is located proximate to a first end 118 of the photovoltaic module 110. In some embodiments, the adhesive 152 is located proximate to a second end 120 of the photovoltaic module 110.

In some embodiments, a transparent portion 164 is formed by the frontsheet 116, the encapsulant 114, the backsheet 128, and the adhesive 152. In some embodiments, the transparent portion 164 extends from a first surface 119 to the second surface 121 of the photovoltaic module 110. In some embodiments, a creepage distance D1 extends from the first end 118 of the photovoltaic module 110 to a first end 160 of the at least one solar cell 112.

Figure 7:
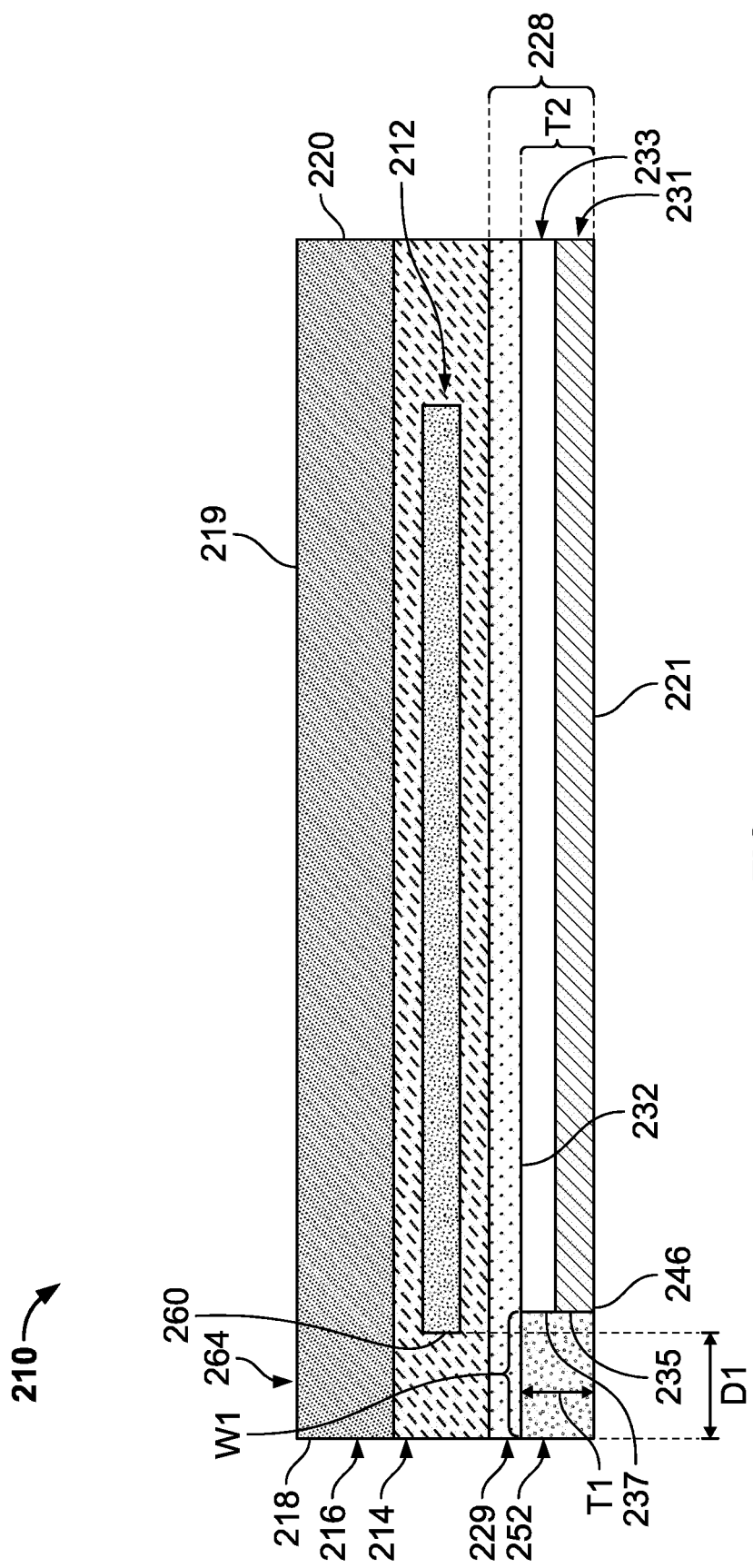
FIG. 7 shows a side schematic view of an embodiment of a photovoltaic module.

FIG. 7 shows an embodiment of a photovoltaic module 210. The photovoltaic module 210 has a structure and function similar to those of the photovoltaic module 10, with certain differences described below. In some embodiments, the photovoltaic module 210 includes at least one solar cell 212, an encapsulant 214 encapsulating the at least one solar cell 212, and a frontsheet 216 juxtaposed with a first surface of the encapsulant 214. In some embodiments, a backsheet 228 is juxtaposed with a second surface of the encapsulant 214.

In some embodiments, the backsheet 228 includes a first layer 229 and a second layer 231. In some embodiments, the first layer 229 is juxtaposed with the second surface of the encapsulant 214. In some embodiments, the first layer 229 extends from a first end 218 of the photovoltaic module 210 to a second end 220 of the photovoltaic module 210, In some embodiments, the first layer 229 is transparent. In some embodiments, the first layer 229 includes polyethylene terephthalate (PET). In some embodiments, the first layer 229 includes ethylene tetrafluoroethylene (ETFE). In some embodiments, the first layer 229 includes tetrafluoroethylene-hexafluoropropylene copolymers (FEP). In some embodiments, the first layer 229 includes ethylene chlorotrifluoroethylene (ECTFE).

In some embodiments, the second layer 231 is juxtaposed with the first layer 229. In some embodiments, the second layer 231 extends from the second end 220 to a first location 246 intermediate the first end 218 and the second end 220. In some embodiments, the second layer 231 is non-transparent. In some embodiments, the second layer 231 is attached to the first layer 229 by an adhesive layer 233. In some embodiments, the adhesive layer 233 extends from the second end 220 to the first location 246.

In some embodiments, an adhesive 252 is attached to a surface 232 of the first layer 229. In some embodiments, the adhesive 252 extends from the first end 218 to the first location 246. In some embodiments, the adhesive 252 is juxtaposed with an end of the second layer 231 and an end of the adhesive layer 233. In some embodiments, a thickness T1 of the adhesive 252 is equal to a total thickness of the second layer 231 and the adhesive layer 233. In some embodiments, the thickness T1 of the adhesive 252 is greater than a total thickness T2 of the second layer 231 and the adhesive layer 233. In some embodiments, the adhesive layer 233 is transparent. In some embodiments, the adhesive layer 233 has a structure similar to that of the adhesive layer 26. In some embodiments, the adhesive layer 233 is selected from the group consisting of polyvinyl butyrate, acrylic, silicone, and polycarbonate adhesives. In some embodiments, the adhesive layer 233 is selected from the group consisting of thermosetting polyolefin, thermosetting polyolefin encapsulant material, thermosetting ethylene-vinyl acetate (EVA), EVA encapsulants, thermoplastic olefin, thermoplastic polyolefin (TPO) and hybrids and combinations thereof. In some embodiments, the adhesive layer 233 includes a thermosetting polyolefin encapsulant material. In some embodiments, the adhesive layer 233 includes a thickness of 1 µm to 900 µm. In some embodiments, the adhesive layer 233 includes a thickness in the same subranges as identified above with respect to the adhesive layer 26.

In some embodiments, a transparent portion 264 is formed by a portion of the frontsheet 216, a portion of the encapsulant 214, a portion of the first layer 229 of the backsheet 228, and the adhesive 252. In some embodiments, the transparent portion 264 extends from a first surface 219 to a second surface 221 of the photovoltaic module 210. In some embodiments, a creepage distance D1 extends from the first end 218 of the photovoltaic module 210 to the first end 260 of the at least one solar cell 212. In some embodiments, the creepage distance D1 is equal to a width W1 of the adhesive 252.

In some embodiments, the adhesive 252 is silicone. In some embodiments, the adhesive 252 is a tape. In some embodiments, the adhesive 252 is VHB tape supplied by 3M. In some embodiments, the adhesive 252 is an acrylic adhesive. In some embodiments, the adhesive 252 is a urethane adhesive. In some embodiments, the adhesive 252 is an epoxy. In some embodiments, the adhesive 252 is butyl. In some embodiments, the adhesive 252 is a polyvinyl acetate (PVA) adhesive. In some embodiments, the adhesive 252 is applied to the photovoltaic module 210 during the manufacture thereof. In some embodiments, the adhesive 252 is applied to the photovoltaic module 210 during the installation of the photovoltaic module 210 on a roof deck. In some embodiments, the adhesive 252 optically couples the photovoltaic module 210 with another photovoltaic module. In some embodiments, the adhesive 252 mechanically couples the photovoltaic module 210 with another photovoltaic module overlayed by the photovoltaic module 210.

Figure 8:
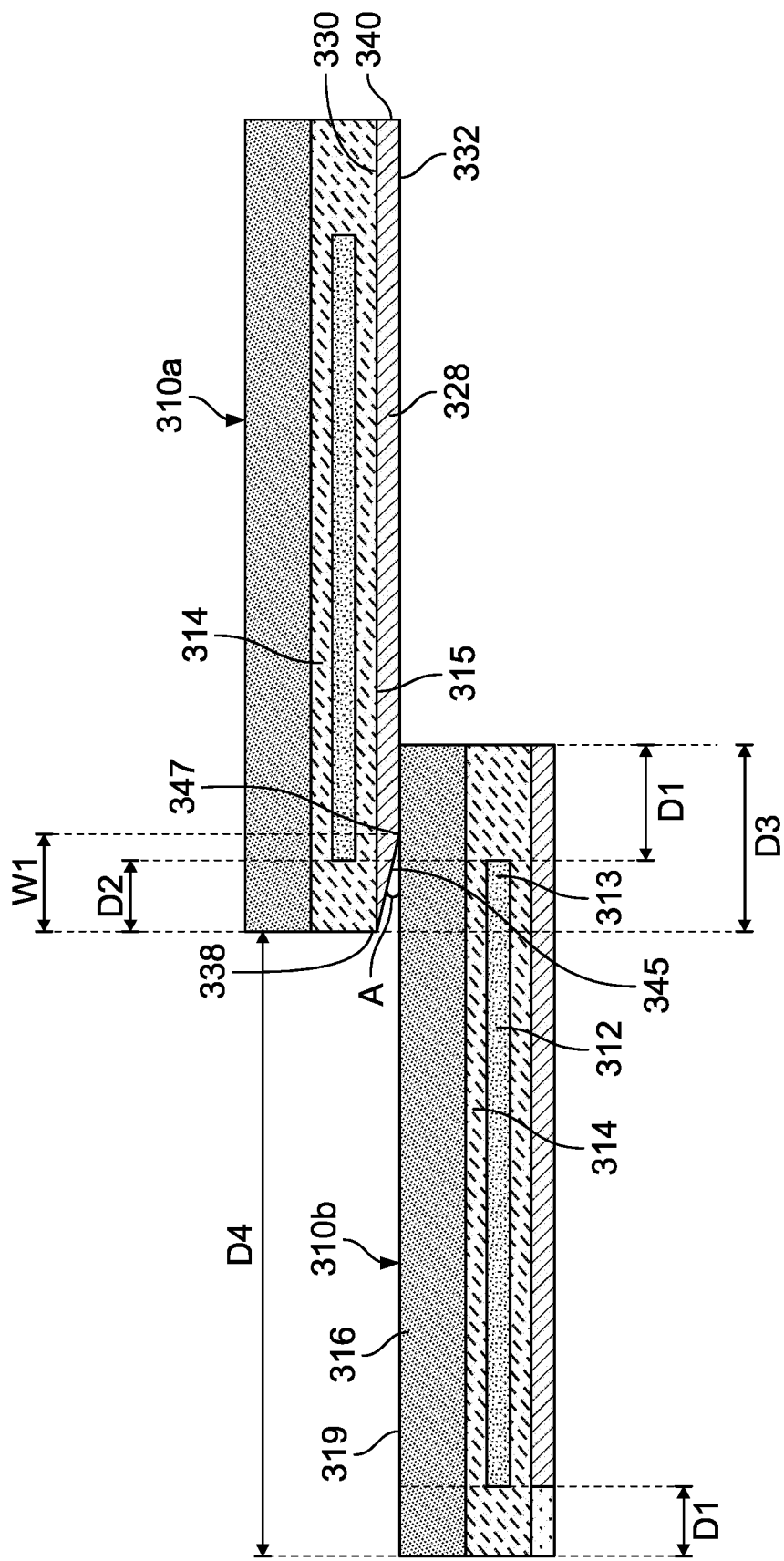
FIG. 8 shows a side schematic view of an embodiment of a system of a plurality of photovoltaic modules.

FIG. 8 shows a side schematic view of embodiments of a system of a plurality of photovoltaic modules 310*a*, 310*b*. In some embodiments, the photovoltaic modules 310*a*, 310*b* have a structure, function and arrangement similar to those of the photovoltaic modules 10*a*, 10*b*, with certain differences described below. In some embodiments, the photovoltaic module 310*a* includes an encapsulant 314 having a surface 315 and a backsheet 328 juxtaposed with the surface 315 of the encapsulant 314. In some embodiments, the backsheet 328 includes a first surface 330, a second surface 332 opposite the first surface 330, a first edge 338, and a second edge 340 opposite the first edge 338. In some embodiments, the backsheet 328 is transparent. In some embodiments, the backsheet 328 is non-transparent. In some embodiments, the backsheet 328 includes a beveled portion 345. In some embodiments, the beveled portion 345 extends from the first edge 338 to a location 347 intermediate the first edge 338 and the second edge 340. In some embodiments, the beveled portion 345 has a width W1. In some embodiments, the width W1 extends from the first edge 338 to the location 347. In some embodiments, the width W1 is equal to an overlap distance D2. In some embodiments, the width W1 is substantially equal to the overlap distance D2. In some embodiments, the width W1 is greater than the overlap distance D2. In some embodiments, the width W1 is less than the overlap distance D2.

In some embodiments, the beveled portion 345 is beveled at an angle A of 5 degrees to 30 degrees relative to a lower surface 315 of the encapsulant 314. In some embodiments, the angle A is 5 degrees to 25 degrees. In some embodiments, the angle A is 5 degrees to 20 degrees. In some embodiments, the angle A is 5 degrees to 15 degrees. In some embodiments, the angle A is 5 degrees to 10 degrees. In some embodiments, the angle A is 10 degrees to 30 degrees. In some embodiments, the angle A is 10 degrees to 25 degrees. In some embodiments, the angle A is 10 degrees to 20 degrees. In some embodiments, the angle A is 10 degrees to 15 degrees. In some embodiments, the angle A is 15 degrees to 30 degrees. In some embodiments, the angle A is 15 degrees to 25 degrees. In some embodiments, the angle A is 15 degrees to 20 degrees. In some embodiments, the angle A is 20 degrees to 30 degrees. In some embodiments, the angle A is 20 degrees to 25 degrees. In some embodiments, the angle A is 25 degrees to 30 degrees.

In some embodiments, the photovoltaic modules 310a, 310b are installed on a roof deck surface of a steep slope roof. As defined herein, a "steep slope roof" is any roof substrate that is disposed on a roof having a pitch of Y/X, where Y and X are in a ratio of 2:12 to 18:12, where Y corresponds to the "rise" of the roof, and where X corresponds to the "run" of the roof.

In some embodiments, Y and X are in a ratio of 5:12 to 12:12. In some embodiments, Y and X are in a ratio of 6:12 to 12:12. In some embodiments, Y and X are in a ratio of 7:12 to 12:12. In some embodiments, Y and X are in a ratio of 6:12 to 12:12. In some embodiments, Y and X are in a ratio of 8:12 to 12:12. In some embodiments, Y and X are in a ratio of 6:12 to 12:12. In some embodiments, Y and X are in a ratio of 9:12 to 12:12. In some embodiments, Y and X are in a ratio of 10:12 to 12:12. In some embodiments, Y and X are in a ratio of 11:12 to 12:12.

In some embodiments, Y and X are in a ratio of 4:12 to 11:12. In some embodiments, Y and X are in a ratio of 4:12 to 10:12. In some embodiments, Y and X are in a ratio of 4:12 to 9:12. In some embodiments, Y and X are in a ratio of 4:12 to 8:12. In some embodiments, Y and X are in a ratio of 4:12 to 7:12. In some embodiments, Y and X are in a ratio of 4:12 to 6:12. In some embodiments, Y and X are in a ratio of 4:12 to 5:12. In some embodiments, Y and X are in a ratio of 5:12 to 11:12. In some embodiments, Y and X are in a ratio of 6:12 to 10:12. In some embodiments, Y and X are in a ratio of 7:12 to 9:12. In some embodiments, Y and X are in a ratio of 2:12. In some embodiments, Y and X are in a ratio of 3:12.

In some embodiments, light enters an area between an upper surface 319 of the photovoltaic module 310b and the beveled portion 345 of the photovoltaic module 310a. In some embodiments, the light reaches at least a portion 313 of at least one solar cell 312 of the photovoltaic module 310b.

Figure 9:
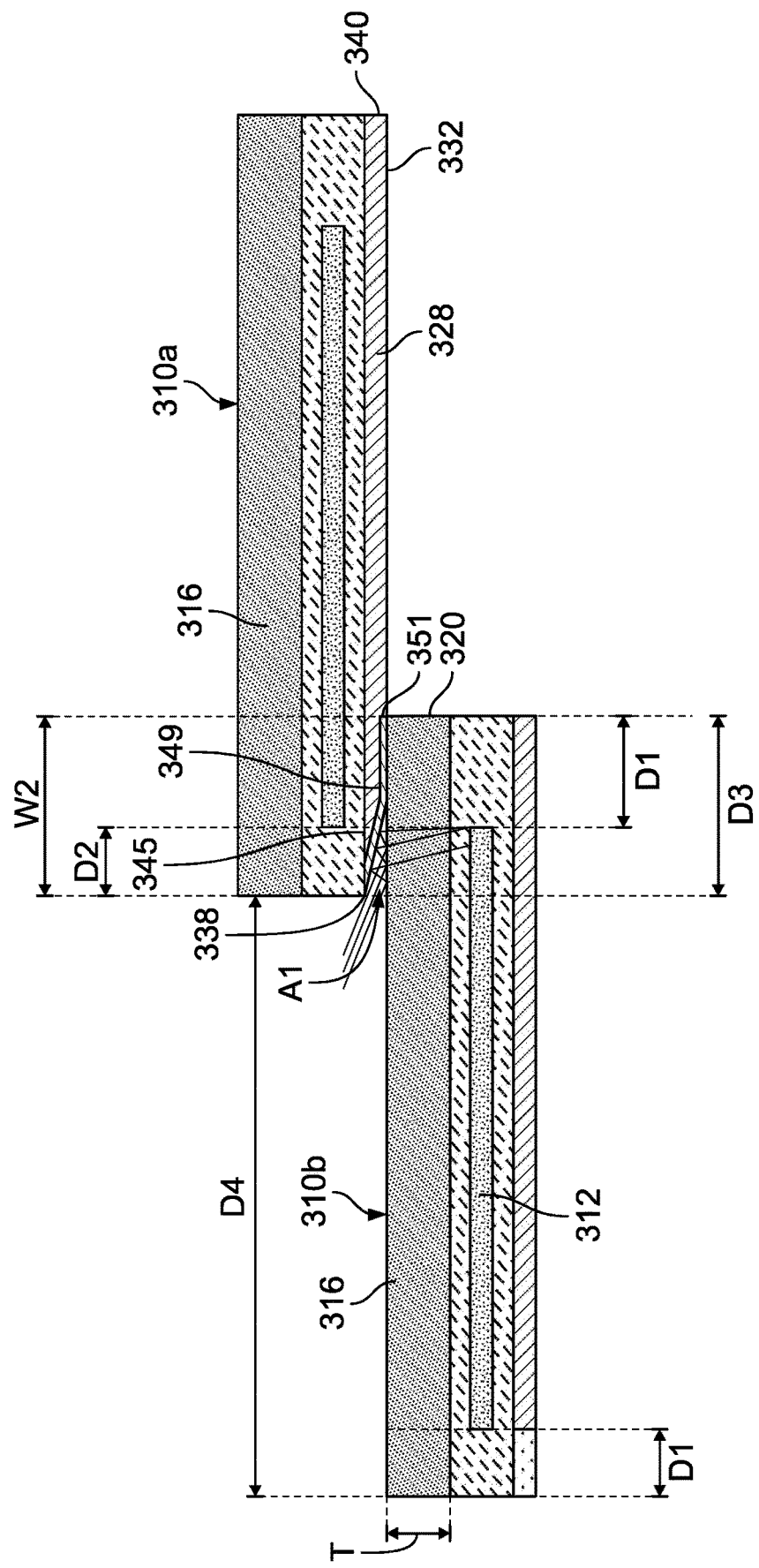
FIG. 9 shows a side schematic view of an embodiment of a system of a plurality of photovoltaic modules.

Referring to FIG. 9, in some embodiments, the backsheet 328 includes a reflective portion 349. In some embodiment, the reflective portion 349 is located on the surface 332 of the backsheet 328. In some embodiments, the reflective portion 349 extends from the first edge 338 to a location 351 between the first edge 338 and the second edge 340. In some embodiment, the reflective portion 349 includes the beveled portion 345. In some embodiments, the reflective portion 349 has a width W2. In some embodiments, the width W2 extends from the first edge 338 to the location 351. In some embodiments, the width W2 is equal to the overlap D3. In some embodiments, the width W2 is substantially equal to the overlap D3. In some embodiments, the width W2 is greater than the overlap D3. In some embodiments, the width W2 is less than the overlap D3.

In some embodiments, the reflective portion 349 includes a reflective color. In some embodiments, the reflective color is white. In some embodiment, the reflective portion 349 is painted. In some embodiments, the reflective portion 349 includes a pigment. In some embodiments, the color of the reflective portion 349 is printed. In some embodiments, reflected light intensity in the area A1 overlapped by the reflective portion 349 will depend on the angle of solar incidence (i.e., a combination of roof pitch and solar elevation), and the width W2. In some embodiments, the more bounces the light has to go through to reach the solar cell 312, the lower the intensity. In some embodiments, the width W2 is less than 1 times a thickness T of the frontsheet 316. In some embodiments, the width W2 is less than 2 times the thickness T of the frontsheet 316. In some embodiments, the width W2 is less than 3 times a thickness T of the frontsheet 316.

While a number of embodiments of the present invention have been described, it is understood that these embodiments are illustrative only, and not restrictive, and that many modifications may become apparent to those of ordinary skill in the art. Further still, the various steps may be carried out in any desired order (and any desired steps may be added and/or any desired steps may be eliminated).

What is claimed is:

1. A system, comprising:
a plurality of photovoltaic modules, each of the photovoltaic modules includes
at least one solar cell;
an encapsulant encapsulating the at least one solar cell, wherein the encapsulant includes a first end, a second end opposite the first end, a first surface extending from the first end to the second end, and a second surface opposite the first surface and extending from the first end to the second end, wherein the encapsulant is transparent;
a frontsheet juxtaposed with the first surface of the encapsulant, wherein the frontsheet includes a first end and a second end opposite the first end of the frontsheet, wherein the frontsheet is transparent; and
a backsheet juxtaposed with the second surface of the encapsulant, wherein the backsheet includes
a first section, and
a second section juxtaposed with the first section,
wherein the first section is transparent,
wherein the second section is non-transparent,
wherein the first end of the frontsheet, the first end of the encapsulant, and the first section of the backsheet form a transparent portion,
wherein a first photovoltaic module of the plurality of photovoltaic modules overlays at least a portion of a second photovoltaic module of the plurality of photovoltaic modules, and
wherein the transparent portion of the first photovoltaic module overlays at least a portion of the at least one solar cell of the second photovoltaic module.

2. The system of claim 1, wherein each of the photovoltaic modules includes
a first edge, and
a second edge opposite the first edge,
wherein the first section extends from the first edge to a first location intermediate the first edge and the second edge, and
wherein the second section extends from the first location to the second edge.

3. The system of claim 2, wherein the backsheet includes a first surface, a second surface opposite the first surface of the backsheet, a first side extending from the first edge to the second edge, and a second side opposite the first side and extending from the first edge to the second edge, wherein the first section extends from the first side to the second side and from the first surface to the second surface.

4. The system of claim 3, wherein the second section extends from the first side to the second side and from the first surface of the backsheet to the second surface of the backsheet.

5. The system of claim 2, wherein the first section includes a width measured from the first edge to the first location.

6. The system of claim 5, wherein the width is 5 mm to 30 mm.

7. The system of claim 1, wherein each of the plurality of photovoltaic modules includes an adhesive juxtaposed with the backsheet, and wherein the adhesive is transparent.

8. The system of claim 7, wherein the adhesive is juxtaposed with the first section.

9. The system of claim 7, wherein the adhesive is substantially aligned with the first section.

10. The system of claim 7, wherein the adhesive optically couples the first photovoltaic module with the second photovoltaic module.

11. The system of claim 5, wherein each of the photovoltaic modules includes a creepage distance extending from the first edge to a first end of the at least one solar cell.

12. The system of claim 11, wherein the creepage distance is equal to the width of the first section of the backsheet.

13. The system of claim 11, wherein the transparent portion of the first photovoltaic module overlays the at least one solar cell at an overlap distance.

14. The system of claim 13, wherein the overlap distance is less than or equal to the creepage distance.

15. The system of claim 11, wherein the first photovoltaic module overlaps the second photovoltaic module of a distance twice the creepage distance.

16. The system of claim 1, wherein the first section includes a first layer and the second section includes a second layer.

17. The system of claim 16, wherein each of the photovoltaic modules includes a first edge, and
a second edge opposite the first edge,
wherein the first layer extends from the first edge to the second edge, and
wherein the second layer extends from the second edge to a first location intermediate the first edge and the second edge.

18. A photovoltaic module, comprising:
at least one solar cell;
an encapsulant encapsulating the at least one solar cell, wherein the encapsulant includes a first end, a second end opposite the first end, a first surface extending from the first end to the second end, and a second surface opposite the first surface and extending from the first end to the second end, wherein the encapsulant is transparent;
a frontsheet juxtaposed with the first surface of the encapsulant, wherein the frontsheet includes a first end and a second end opposite the first end of the frontsheet, wherein the frontsheet is transparent; and
a backsheet juxtaposed with the second surface of the encapsulant, wherein the backsheet includes
a first section, and
a second section juxtaposed with the first section,
wherein the first section is transparent,
wherein the second section is non-transparent,
wherein the first end of the frontsheet, the first end of the encapsulant, and the first section of the backsheet form a transparent portion,
wherein the transparent portion of the photovoltaic module is configured to overlay at least a portion of at least one solar cell of another photovoltaic module.

\* \* \* \* \*